United States Patent
Yoon et al.

(10) Patent No.: US 7,323,375 B2
(45) Date of Patent: Jan. 29, 2008

(54) FIN FIELD EFFECT TRANSISTOR DEVICE AND METHOD OF FABRICATING THE SAME

(75) Inventors: Jae-Man Yoon, Seoul (KR); Dong-Gun Park, Gyeonggi-do (KR); Choong-Ho Lee, Gyeonggi-do (KR); Chul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 263 days.

(21) Appl. No.: 11/091,457

(22) Filed: Mar. 28, 2005

(65) Prior Publication Data

US 2005/0250285 A1    Nov. 10, 2005

(30) Foreign Application Priority Data

May 4, 2004    (KR)    ............... 10-2004-0031467

(51) Int. Cl.
*H01L 21/00*    (2006.01)
(52) U.S. Cl. .................................................. 438/164
(58) Field of Classification Search ............. 438/164, 438/151, 149, 154
See application file for complete search history.

(56) References Cited

U.S. PATENT DOCUMENTS

| | | | |
|---|---|---|---|
| 6,468,887 B2 | 10/2002 | Iwasa et al. | |
| 6,548,859 B2 | 4/2003 | Maegawa | |
| 6,762,448 B1 * | 7/2004 | Lin et al. | 257/302 |
| 7,141,456 B2 * | 11/2006 | Lee et al. | 438/135 |
| 7,148,541 B2 * | 12/2006 | Park et al. | 257/347 |
| 7,153,733 B2 * | 12/2006 | Seo et al. | 438/197 |
| 7,176,067 B2 * | 2/2007 | Jung et al. | 438/144 |
| 2004/0048424 A1 * | 3/2004 | Wu et al. | 438/154 |
| 2004/0253775 A1 * | 12/2004 | Achuthan et al. | 438/197 |
| 2005/0019993 A1 * | 1/2005 | Lee et al. | 438/157 |
| 2005/0153490 A1 * | 7/2005 | Yoon et al. | 438/164 |
| 2005/0272192 A1 * | 12/2005 | Oh et al. | 438/197 |
| 2007/0090443 A1 * | 4/2007 | Choi et al. | 257/314 |

FOREIGN PATENT DOCUMENTS

| | | |
|---|---|---|
| JP | 11-068069 | 3/1999 |
| JP | 2002-151688 | 5/2002 |
| KR | 10-2002-0018059 | 3/2002 |

OTHER PUBLICATIONS

Notice to File a Response/Amendment to the Examination Report for Korean Patent Application No. 10-2004-0031467 mailed on Jan. 18, 2006.

* cited by examiner

*Primary Examiner*—Mary Wilczewski
*Assistant Examiner*—Seth Barnes
(74) *Attorney, Agent, or Firm*—Myers Bigel Sibley & Sajovec PA

(57) ABSTRACT

Methods of forming field effect transistors (FETs) having fin-shaped active regions include patterning a semiconductor substrate to define a fin-shaped semiconductor active region therein, which is surrounded by a trench. At least an upper portion of the fin-shaped semiconductor active region is covered with a sacrificial layer. This sacrificial layer is selectively etched-back to define sacrificial spacers on sidewalls of the fin-shaped semiconductor active region. The electrically insulating region is formed on the sacrificial spacers. The sacrificial spacers are then removed by selectively etching the sacrificial spacers using the electrically insulating region as an etching mask. An insulated gate electrode is then formed on the sidewalls of the fin-shaped semiconductor active region.

21 Claims, 28 Drawing Sheets

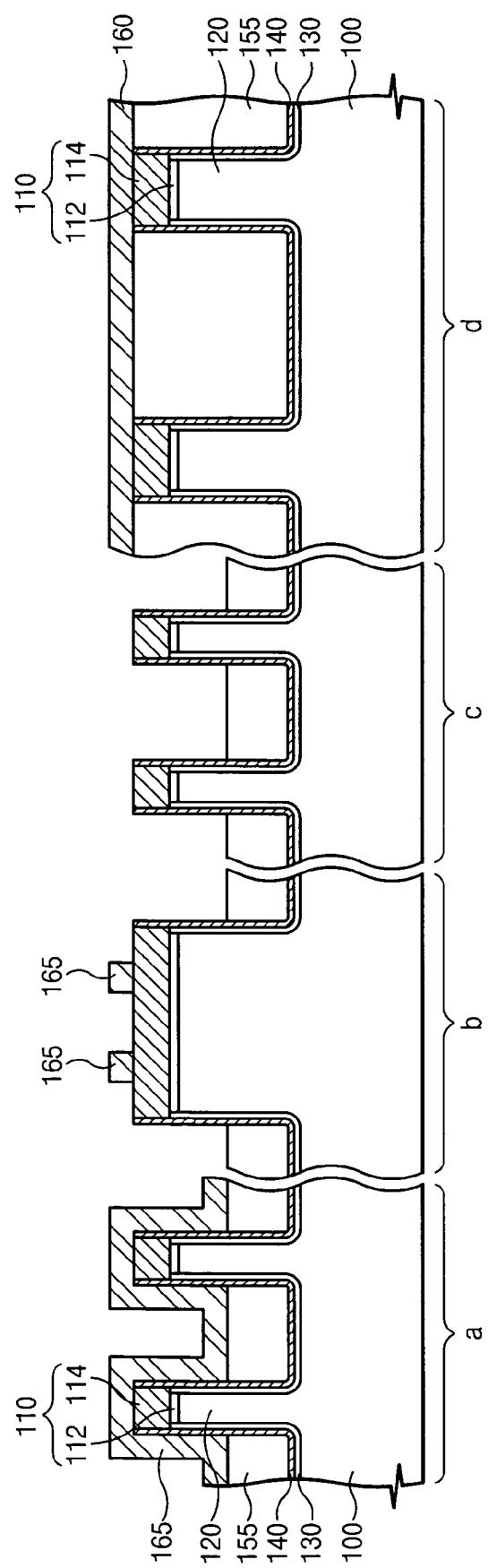

FIN FIELD EFFECT TRANSISTOR DEVICE AND METHOD OF FABRICATING THE SAME

REFERENCE TO PRIORITY APPLICATION

This application claims priority from Korean Patent Application No. 2004-31467, filed May 4, 2004, the disclosure of which is hereby incorporated herein by reference.

FIELD OF THE INVENTION

The present invention related to integrated circuit devices and, more particularly, to field effect transistors and methods of forming field effect transistors.

BACKGROUND OF THE INVENTION

Field effect transistors (FET) include an active region, a gate electrode crossing over the active region, and source/drain electrodes formed adjacent the gate electrode. An active region under the gate electrode is used as a channel region that provides a moving path of charges (when the FET is turned on). With the high integration of semiconductor devices, the widths of the gate electrodes and active regions have become reduced. If, however, the width of the gate electrode is reduced, a length of the channel region (a space between a source region and a drain region) is also reduced. As a result, short channel effects (SCE), such as drain induced barrier lowering (DIBL) or punch-through, may occur. If the width of the active region is reduced, the width of the channel region (a length of a gate electrode in contact with the active region) may also be reduced, which may cause a narrow width effect that increases transistor threshold voltage.

The short channel effect and the narrow width effect occur because a voltage of the gate electrode controls an electronic state of the channel region incompletely. In order to completely control the electronic state of the channel region, a FinFET having a vertical channel region is suggested in U.S. Pat. No. 6,468,887. Since a gate electrode controls a channel region at three sides in this FinFET, it is possible to dramatically improve short channel effect and narrow width effect.

FIGS. 1 to 5 are cross-sectional views illustrating a method of fabricating the FinFET explained in U.S. Pat. No. 6,468,887. Referring to FIG. 1, a trench mask 3 is formed at a predetermined region of a semiconductor substrate 1. The semiconductor substrate 1 is anisotropically etched using the trench mask 3 as an etch mask. A fin-shaped active pattern 11 is formed under the trench mask pattern 3. Then, a sacrificial spacer 5 is formed on sidewalls of the active pattern 11.

An insulating layer is formed on a resultant structure where the sacrificial spacer 5 is formed. The insulating layer is planarizingly etched until the trench mask 3 and the sacrificial spacer 5 are exposed. Accordingly, a device isolation layer 23 filling a space between the active patterns 11 is formed. After that, the exposed trench mask 3 and the sacrificial spacer 5 are removed to form an opening 6. As illustrated by FIG. 2, the opening 6 exposes a lower surface (an upper surface of the semiconductor substrate 1) of the trench 2 between the device isolation layer 23 and the active pattern 11. Referring now to FIG. 3, a gate insulating layer 12 is formed on a surface of the active pattern 11 exposed by the opening 6. A gate conductive layer filled in the opening 6 is formed on the above resultant structure. Continuously, the gate conductive layer is patterned to form a gate electrode crossing over the active pattern 11.

After forming the gate electrode 22, impurity regions 24 are formed by performing an ion implantation process using the gate electrode 22 and the device isolation layer 23 as a mask. FIGS. 4 and 5 are cross-sectional views that show a resultant structure where the impurity region 24 is formed in the vertical direction with respect to FIG. 3 and show sections at a position of the active pattern (I) 11 and the opening (II) 6.

In accordance with U.S. Pat. No. 6,468,887, the opening 6 forms a closed curve exposing a lower surface of the trench 2 at the edge of the active pattern 11. In order to form the gate electrode 22 without a bridge, the gate conductive layer should be etched until the lower surface of the trench 2. However, now that the gate conductive layer has a significant thickness difference, it is difficult to pattern the gate conductive layer without etching damage. In other words, since a thickness $h_1$ of the gate conductive layer filled in the opening 6 is still thicker than a thickness $h_2$ of the gate conductive layer stacked on the active pattern 11, it is difficult for the gate conductive layer to be completely etched in the opening 6 without causing etching damage with respect to the active pattern 11. In particular, a feasibility of the above-mentioned etching process for forming the gate electrode 22 is little in that the gate conductive layer and the active pattern 11 are formed of silicon.

Furthermore, in accordance with U.S. Pat. No. 6,468,887, since a part of the opening 6 (a region is not covered with the gate electrode 22) is exposed during an ion implantation process for forming the impurity region 24; parasitic impurity regions 24' may be formed under the opening 6. In this case, as shown in FIG. 5, the parasitic impurity regions 24' are constituted by a parasitic transistor together with the gate electrode 22 and the gate insulating layer 12.

SUMMARY OF THE INVENTION

Methods according to embodiments of the invention include methods of forming field effect transistors (FETs) having fin-shaped active regions. These methods may include patterning a semiconductor substrate to define a fin-shaped semiconductor active region therein, which is surrounded by a trench. At least an upper portion of the fin-shaped semiconductor active region is covered with a sacrificial layer. This sacrificial layer is selectively etched-back to define sacrificial spacers on sidewalls of the fin-shaped semiconductor active region. The electrically insulating region is formed on the sacrificial spacers. The sacrificial spacers are then removed by selectively etching the sacrificial spacers using the electrically insulating region as an etching mask. An insulated gate electrode is then formed on the sidewalls of the fin-shaped semiconductor active region.

Additional method embodiments include patterning a semiconductor substrate to define a fin-shaped semiconductor active region therein, which is surrounded by a trench. At least a portion of the trench is then filled with a first electrically insulating region. At least an upper portion of the fin-shaped semiconductor active region and the first electrically insulating region is covered with a sacrificial layer (e.g., polysilicon layer). The sacrificial layer is selectively etched to define sacrificial spacers on sidewalls of the fin-shaped semiconductor active region and expose a portion of the first electrically insulating region. A second electrically insulating region is formed on the exposed portion of the first electrically insulating region. The sacrificial spacers are then removed by selectively etching the sacrificial spacers using the second electrically insulating region as an etching mask. An insulated gate electrode is then formed on the sidewalls of the fin-shaped semiconductor active region.

A FinFET device according to additional embodiments of the invention includes a first device isolation layer filled in a lower portion of a trench. This device includes active patterns, a first device isolation layer, and a second device isolation layer. The active patterns are formed at a predetermined region of a semiconductor substrate. The first device isolation layer is filled in a lower portion between the active patterns. The second device isolation layer is arranged on the first device isolation layer and is filled in an upper space between the active patterns. At this time, the second device isolation layer has an opening formed at a lateral surface of the active patterns. The opening is filled with a gate electrode, which crosses over the second device isolation layer and the active patterns. Each of the openings of the second device isolation layer is locally formed under the gate electrode not to be extended to a lower portion of neighboring gate electrode.

In accordance with additional embodiments of the present invention, a gate insulating layer is further interposed between the gate electrode and the active patterns. The gate insulating layer may be formed of at least one selected from the group consisting of $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, Hf silicate, $La_2O_3$, $La_2AlO_3$, $LaScO_5$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_3$, $Y_xSi_yO_z$, $ZrO_2$, Zr silicate, Zr—Al—O, and $(Zr, Sn)TiO_4$. The gate insulating layer may be formed of silicon oxide, silicon nitride, and silicon oxide, which are sequentially stacked.

In further embodiments of the invention, a trench mask pattern may be further interposed between the gate electrode and an upper surface of the active pattern.

Moreover, the gate electrode may be constituted by a lower gate electrode, a gate interlayer insulating layer, and an upper gate electrode, which are sequentially stacked. At this time, it is preferable that the gate interlayer insulating layer may be at least one selected from high-k dielectric materials including $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, Hf silicate, $La_2O_3$, $La_2AlO_3$, $LaScO_5$, $La_2SiO_5$, $MaAl_2O_4$, $NdAlO_3$, $PrAlO_3$, $SMAlO_3$, $SrTiO_3$, $Ta_2O_5$, $TiO_2$, $Y_2O_3$, $Y_xSi_yO_z$, $ZrO_2$, Zr silicate, Zr—Al—O, and $(Zr, Sn)TiO_4$.

A method of fabricating a FinFET device according to additional embodiments of the invention includes a step of forming an opening for a vertical extension part using a sacrificial spacer. In particular, a step is performed to pattern a semiconductor substrate to form trenches defining active patterns and then formed a first device isolation layer filled in a lower portion of the trenches. A sacrificial pattern is formed crossing the active patterns on a resultant structure. The sacrificial pattern is etched to form sacrificial spacers arranged on sidewalls of the active patterns. A second device isolation layer, which exposes an upper surface of the sacrificial spacer and is filled in an upper portion of the trench, is formed. Then, the exposed sacrificial spacers are removed to form openings exposing a lateral surface of the active pattern. Gate electrodes, which are filled with the openings and cross over the active patterns, are then formed.

The step of forming the gate electrode may include forming a gate conductive layer filled in the opening and patterning the gate conductive layer until an upper surface of the second device isolation layer is exposed. At this time, only a gate conductive layer arranged above the upper surface of the second device isolation layer is etched, and a gate conductive layer filled with the opening is not etched. Accordingly, an etching process for forming the gate electrode can be performed without an etch thickness difference by a position.

The step of forming the trench may include the steps of forming a trench mask pattern on the semiconductor substrate and anisotropically etching the semiconductor substrate by a predetermined depth using the trench mask pattern as an etch mask. In addition, the step of forming the first device isolation layer includes the steps of forming a first insulating layer on inner sidewalls of the trench and conformally forming a second insulating layer on a resultant structure where the first insulating layer is formed. A third insulating layer is filled with the trench on a resultant structure where the second insulating layer is formed. The third insulating layer is etched to form the first device isolation layer having a lower top surface than the active pattern. At this time, the trench mask pattern is formed of at least one selected from the group consisting of silicon oxide, silicon nitride, hafnium oxide, and aluminum oxide. The step of forming the first insulating layer includes a step of forming silicon oxide using a thermal oxidation process. The step of forming the second insulating layer includes a step of forming silicon nitride using a chemical vapor deposition method.

BRIEF DESCRIPTION OF THE DRAWINGS

FIGS. 10A-20A are cross-sectional views of intermediate structures that illustrate methods of forming the integrated circuit devices of FIGS. 6A-6B.

FIGS. 10B-20B are perspective views of intermediate structures that illustrate methods of forming the integrated circuit devices of FIGS. 6A-6B.

DETAILED DESCRIPTION OF THE PREFERRED EMBODIMENT

Figure 1:
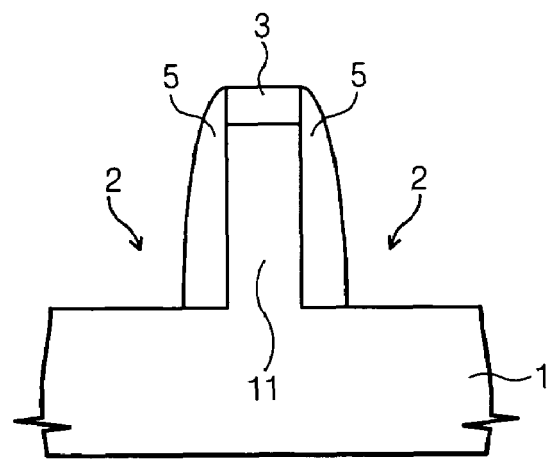
FIGS. 1-5 are cross-sectional views of intermediate structures that illustrate a conventional method of forming a semiconductor device.
Figure 2:
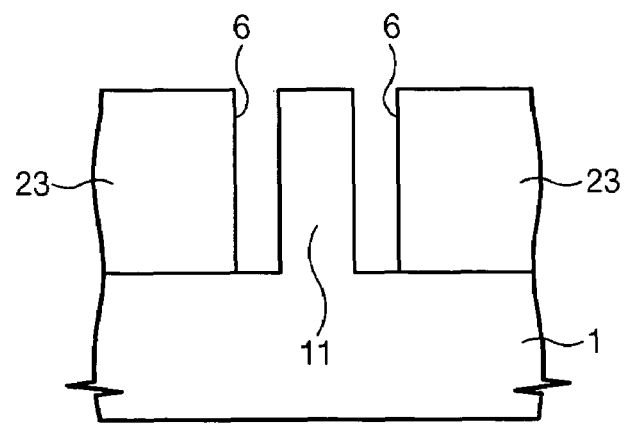
Figure 3:
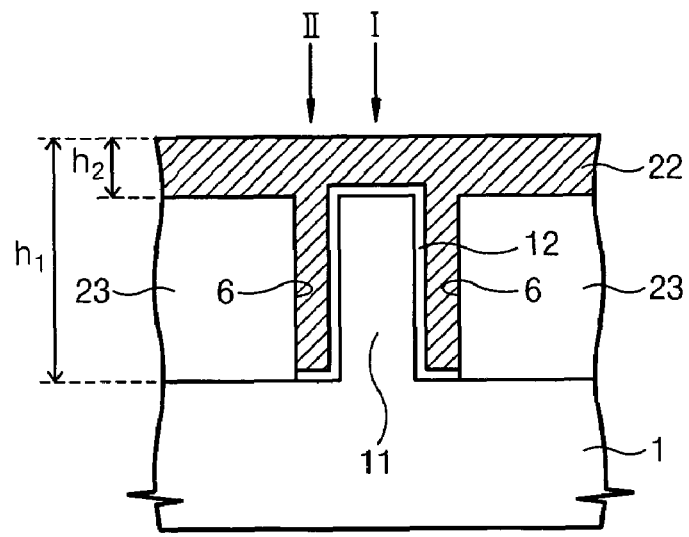
Figure 4:
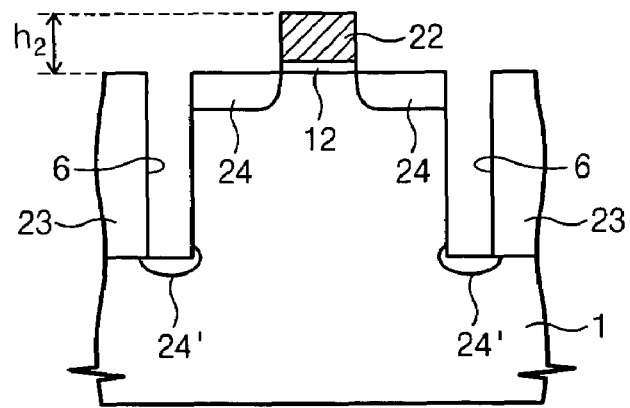
Figure 5:
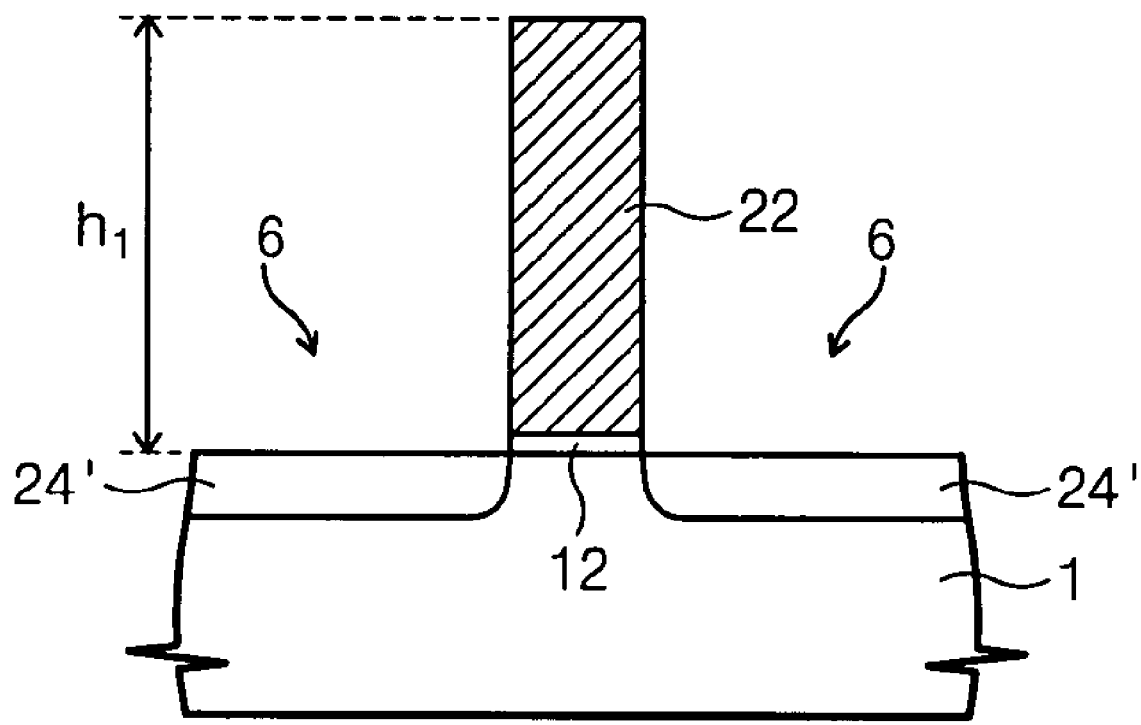

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Figure 6A:
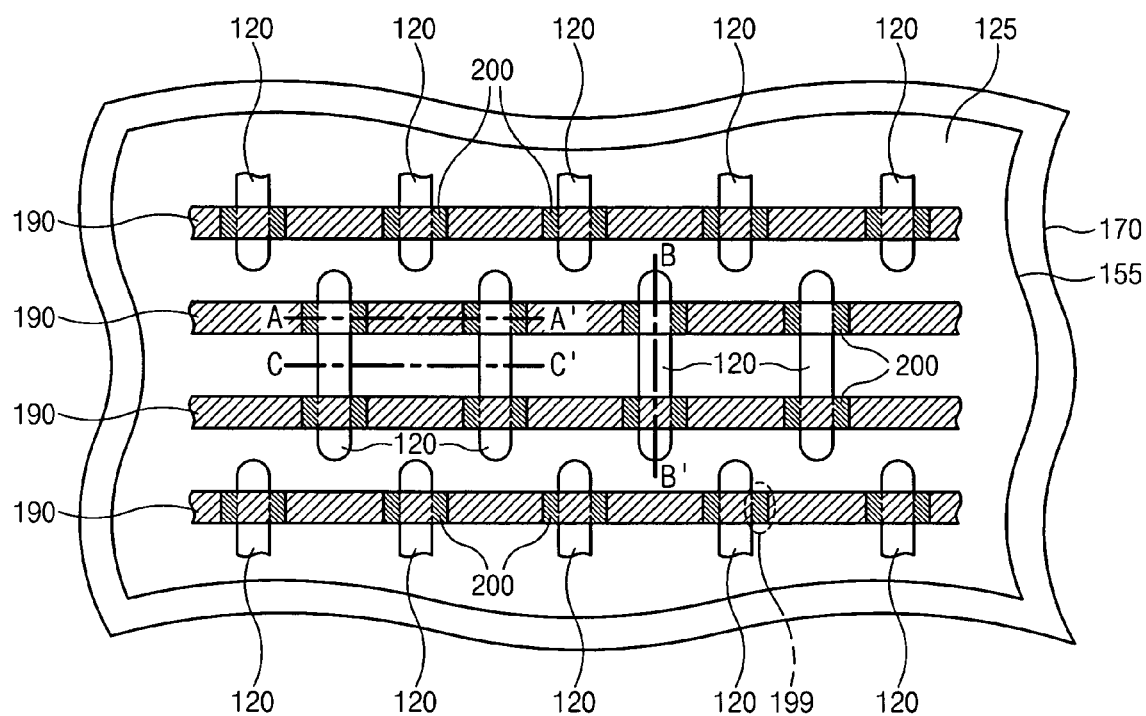
FIGS. 6A-6B are layout views of an integrated circuit device having an array of FinFET transistors therein, according to embodiments of the invention.
Figure 6B:
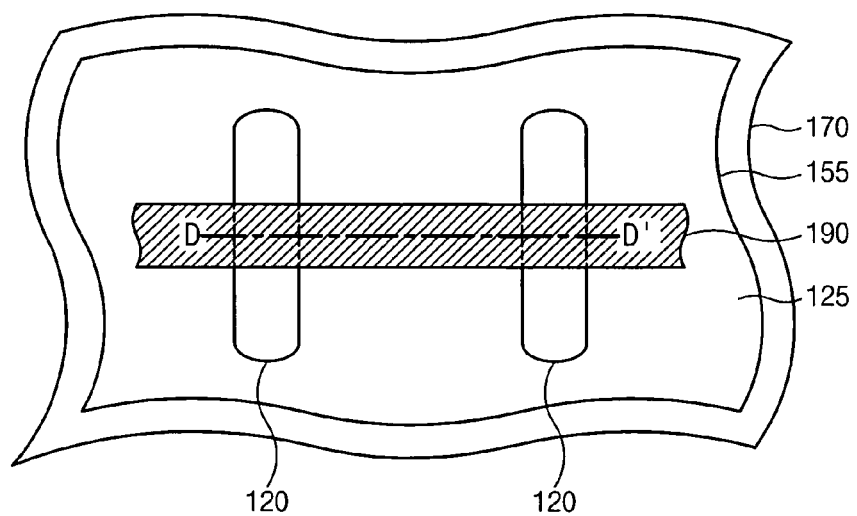
Figure 7:
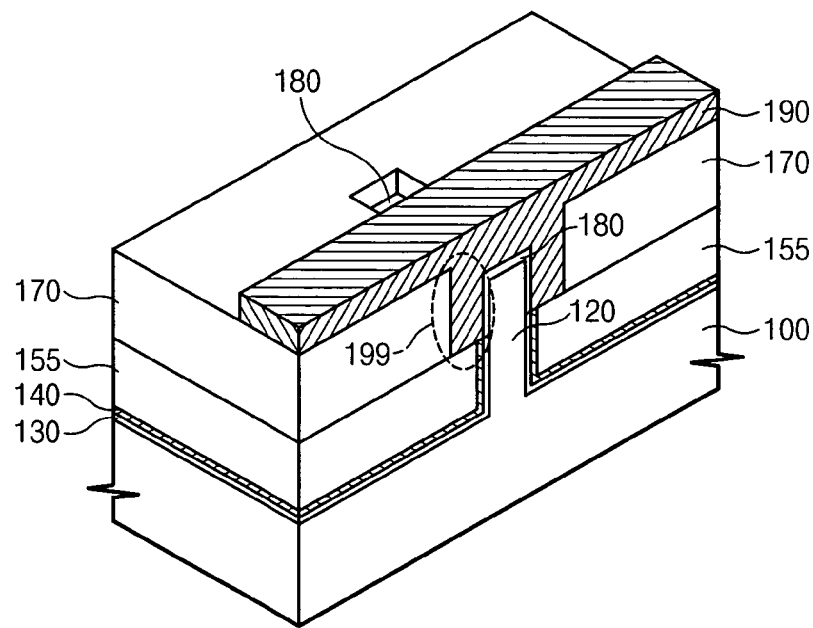
FIGS. 7-9 are perspective views of semiconductor devices according to embodiments of the invention.
Figure 8:
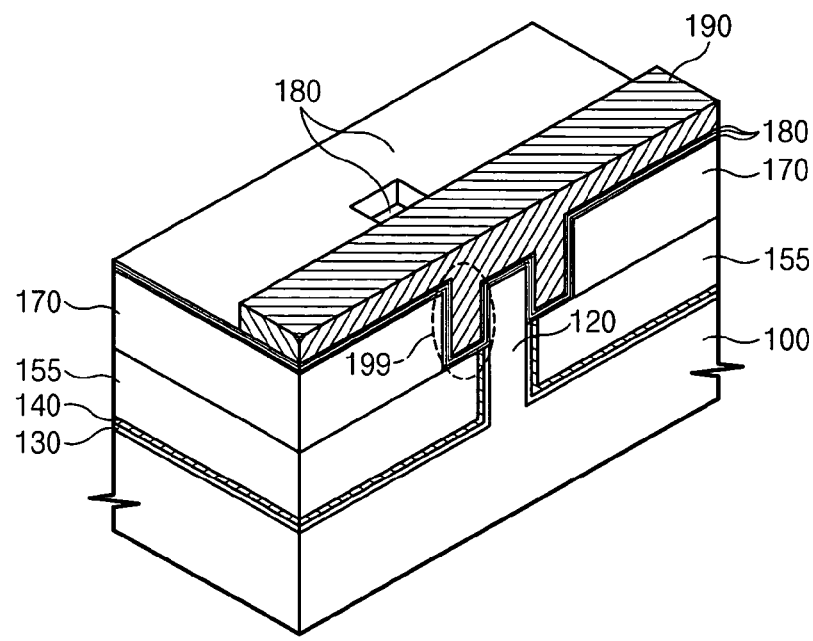
Figure 9:
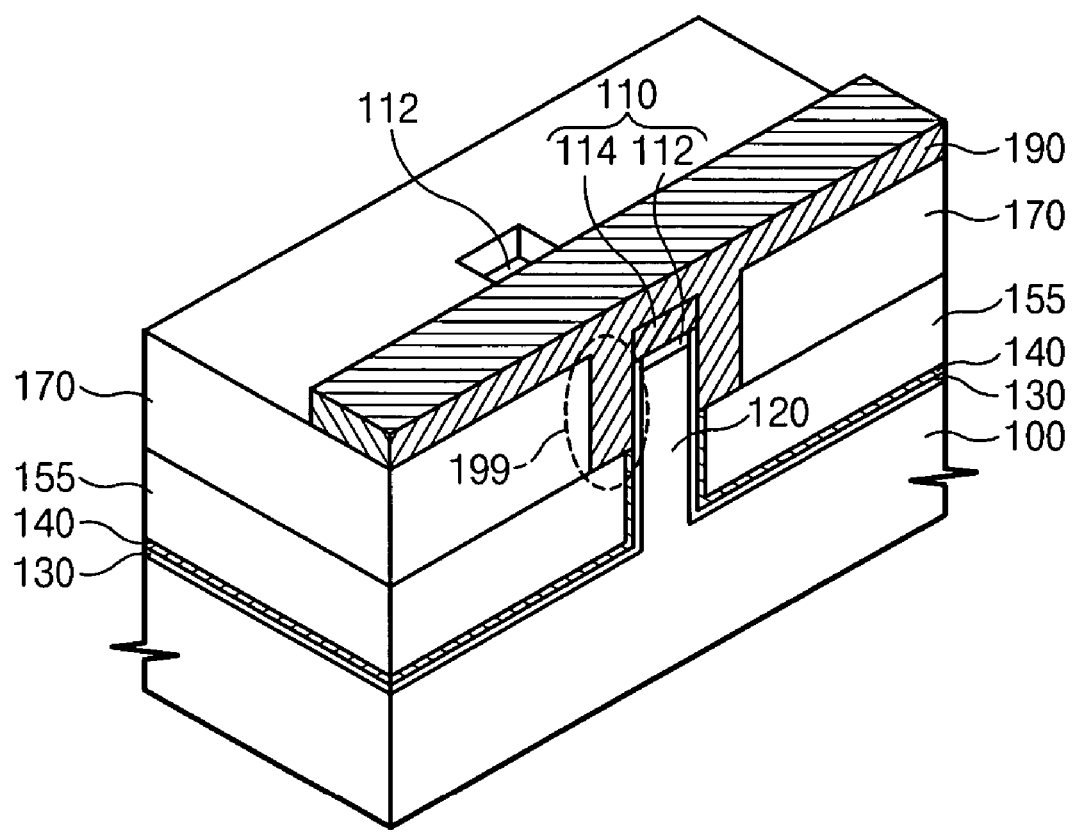

FIGS. 6A and 6B are plan views illustrating a semiconductor device according to embodiments of the present invention. This embodiment of the present invention is applicable to a DRAM device. FIGS. 6A and 6B show a cell array region and a peripheral circuit region of the DRAM device, respectively. FIGS. 7 to 9 are perspective views showing the semiconductor device according to embodiments of the present invention.

Referring to FIGS. 6A and 7, active patterns 120 are arranged at a predetermined region of a semiconductor substrate 100. The active patterns 120 may be fin-shaped, and as shown in FIGS. 6A and 7, are arranged regularly. A first device isolation layer 155 and a second device isolation layer 170, which are sequentially stacked, are filled within a space (a trench 125) between the active patterns 120. The first device isolation layer 155 is filled in a lower portion of the trench 125. The second device isolation layer 170 is filled in an upper region of the trench 125 at a lateral surface of the active patterns 120. At this time, the second device isolation layer 170 has an opening 200 exposing an upper surface of the first device isolation layer 155.

A plurality of gate patterns 190 crossing over the active patterns 120 are arranged on an upper portion of the second device isolation layer 170. A gate insulating layer 180 is interposed between the gate patterns 190 and the active patterns 120. The gate patterns 190 has a vertical extension part 199 filled in the opening 200. Consequently, the vertical extension part 199 is arranged between the second device isolation layer 170 and the active pattern 120. At this time, the second device isolation layer 170 covers the vertical extension part 199 of one gate pattern 190. Therefore, vertical extension parts 199 of neighboring gate patterns are separated by the second device isolation layer 170. Resultantly, each of the openings 200 is arranged locally under a corresponding gate pattern 190 and do not extend to a lower portion of another gate pattern 190.

According to this embodiment, two gate patterns 190 are arranged on an upper portion of one active pattern 120. Accordingly, one active pattern 120 is divided into three regions. Impurity regions used as source/drain regions of a transistor are formed at the three regions. Thus, two fin field effect transistors (Fin-FET) are formed at one active pattern 120.

A first insulating layer 130 and a second insulating layer 140, which are stacked sequentially, may be interposed between the first device isolation layer 155 and the semiconductor substrate 100. In accordance with one embodiment of the present invention, the first insulating layer 130 may be silicon nitride, and the second insulating layer 140 may be silicon nitride. The first and second insulating layers 130 and 140 are extended to be interposed between the first and second device isolation layers 155 and 170, and the active pattern 120. However, the first and second insulating layers 130 and 140 are still not formed in the opening 200.

The gate insulating layer may be at least one selected from the group consisting of $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, Hf silicate, $La_2O_3$, $La_2AlO_3$, $LaScO_5$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_3$, $Y_xSi_yO_z$, $ZrO_2$, Zr silicate, Zr—Al—O, and $(Zr, Sn)TiO_4$. According to one embodiment of the present invention, the gate insulating layer is formed of a single layer such as silicon oxide. According to another embodiment, the gate insulating layer 180 may be used as a charge storage layer of non-volatile memory transistors with a SONOS or MONOS structure, as illustrated by FIG. 8. In this case, the gate insulating layer 180 includes silicon nitride. Preferably, the gate insulating layer 180 is formed of silicon oxide, silicon nitride, and silicon oxide, which are stacked sequentially.

According to an embodiment of FIG. 9, a trench mask pattern 110 is arranged on an upper surface of the active patterns 120. In this case, since the upper surface of the active pattern 120 is separated from the gate pattern 190, both lateral surfaces of the active pattern 120 are only used as a channel region of a FinFET. Here, the first insulating layer 180 can be used as a gate insulating layer. Meanwhile, since a transistor formed at a peripheral circuit region may need to have a longer channel length than cell transistors, there is little technical difficulty related to short channel effects. Therefore, transistors formed at the peripheral region may have a structure of an ordinary MOS transistor or a structure of the above-mentioned FinFET. Transistors with a FinFET structure for a peripheral circuit are easily embodied referring to the structure of the above-mentioned cell transistor, and transistors with the ordinary MOS structure for a peripheral circuit will be described hereinafter.

Referring again to FIG. 6, the active pattern 120 at a peripheral circuit region may have various shapes. In addition, a space between the active patterns 120 is filled with the first device isolation layer 155. In other words, the second device isolation layer 170 may not be formed at the peripheral circuit region. The gate patterns 190 cross over the active pattern in which the gate insulating layer 180 is formed.

FIGS. 10A to 20A are procedural section views illustrating a method of fabricating a semiconductor device according to one embodiment of the present invention. The reference letters 'a', 'b', 'c', and 'd' shown in FIGS. 10A to 20A indicate sections shown along dotted lines A-A', B-B' and C—C' of FIG. 6A, and dotted lines D-D' of FIG. 6B. FIGS. 10B to 20B are perspective views showing a part of a cell array region in the same step as FIGS. 10a to 20A, respectively.

Figure 10A:
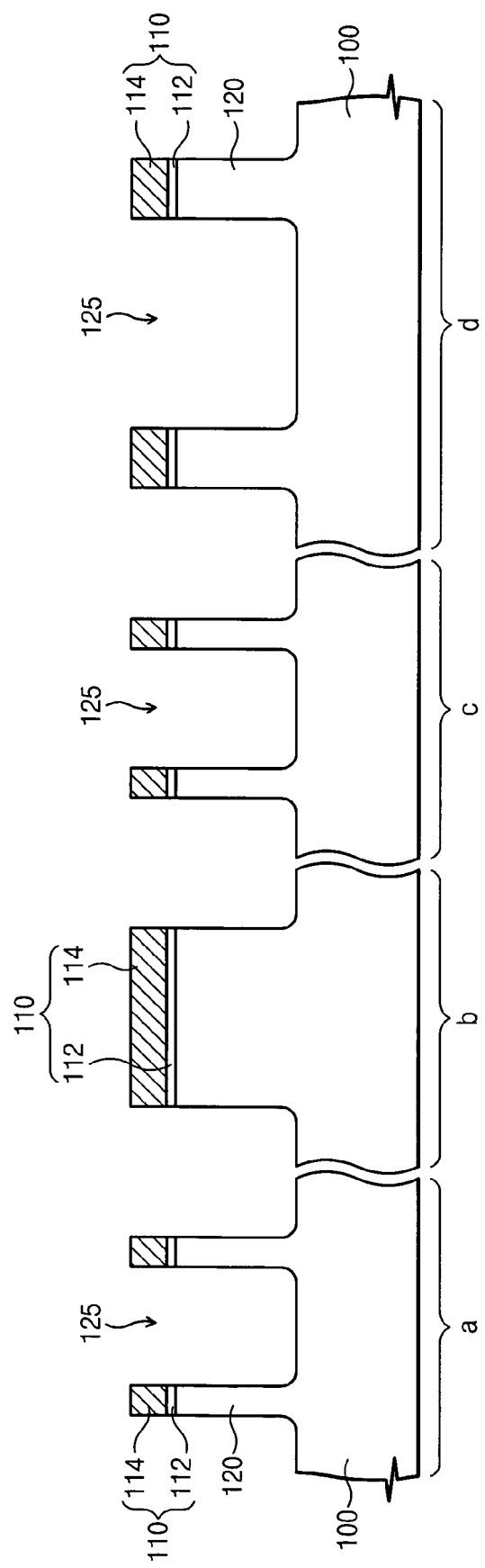
Figure 10B:
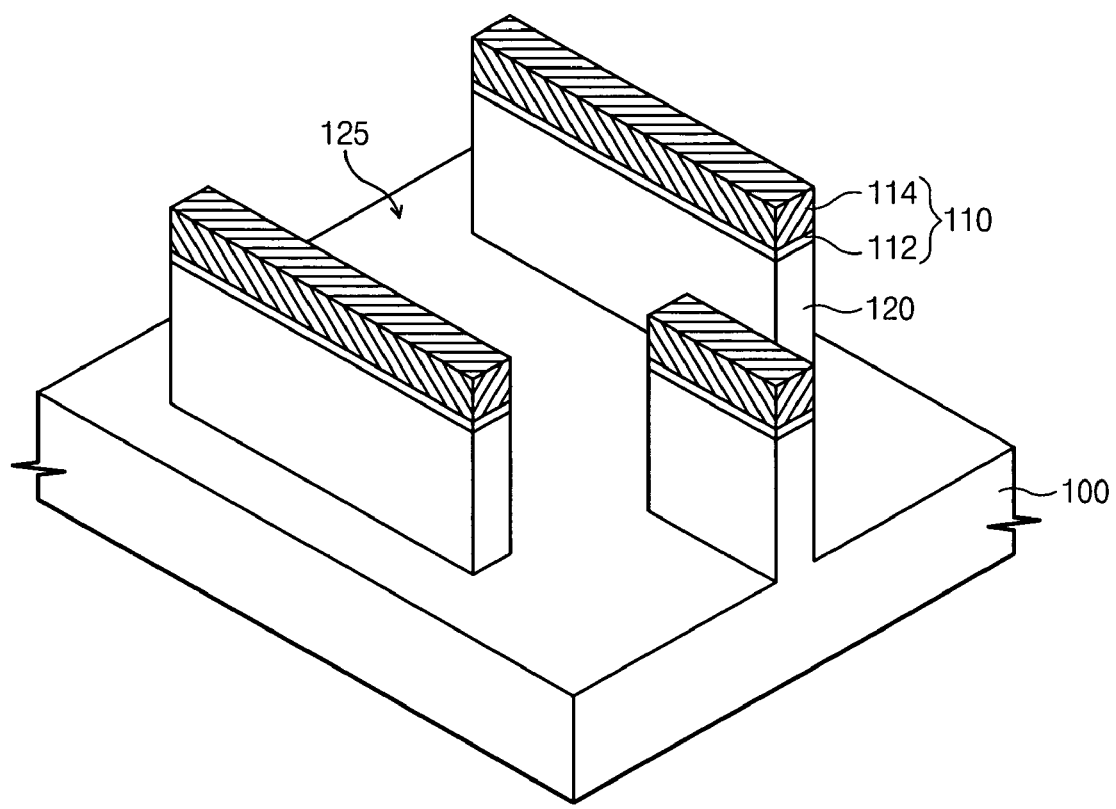

Referring to FIGS. 10A to 10B, a trench mask pattern 110 is formed on a semiconductor substrate 100. The trench mask pattern 110 may be formed of at least one selected from the group consisting of silicon oxide, silicon nitride, silicon oxynitride, hafnium oxide, and aluminum oxide. In accordance with one embodiment of the present invention, the trench mask pattern 110 is formed of a buffer layer 112 and a hard mask layer 114, which are stacked sequentially. At this time, it is preferable that the buffer layer 112 is silicon oxide, which is formed using a thermal oxidation process and having a thickness of about 50 to 150 Å, and the hard mask layer 114 is silicon nitride having a thickness of about 500 to 1000 Å.

In this embodiment, the trench mask pattern 110 (as shown in FIGS. 6A and 6B) is like a rectangular island shape in a two-dimensional structure and like a fin shape in a three-dimensional structure. However, the trench mask pattern 110 may have various shapes according to a kind of a semiconductor device. For instance, in case of a flash memory, the trench mask pattern 110 may be like a plane stripe shaped.

The semiconductor substrate 100 is anisotropically etched to a depth of approximately 2000 to 3500 Å using the trench mask pattern 110 as an etch mask. Thus, a trench 125 defining active patterns 120 is formed around the trench mask pattern 110. The active patterns 120 are used as an active region of a transistor. That is, source/drain regions, and a channel region, which are constituted by a MOS transistor, are formed at the active pattern 120 in a subsequent process.

Figure 11A:
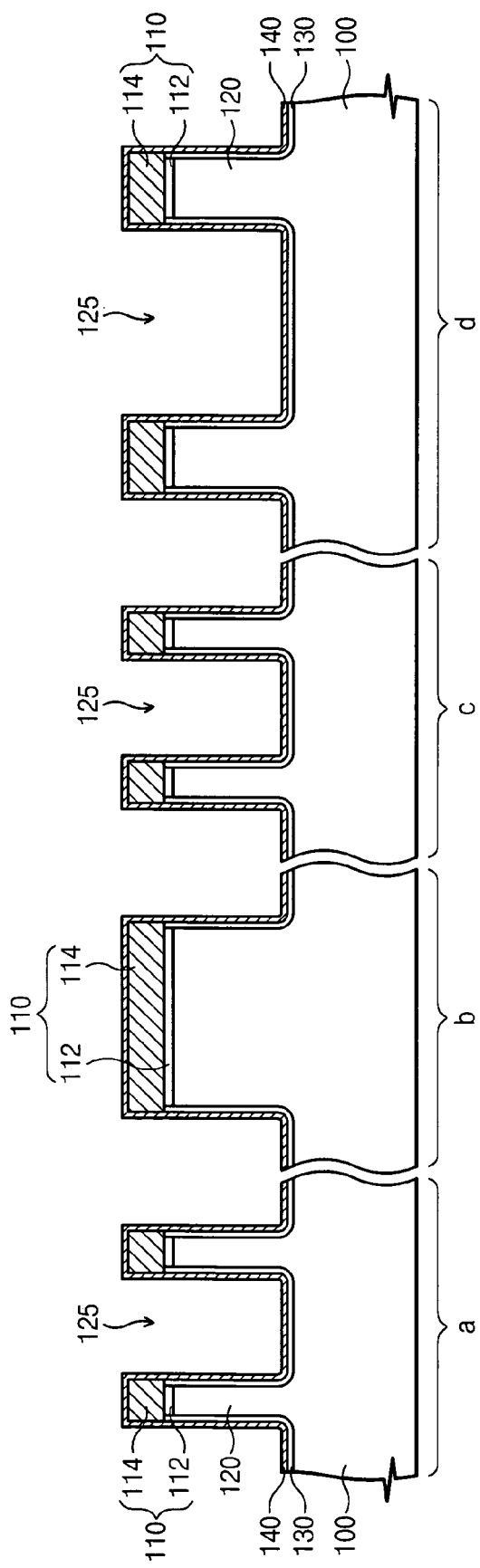
Figure 11B:
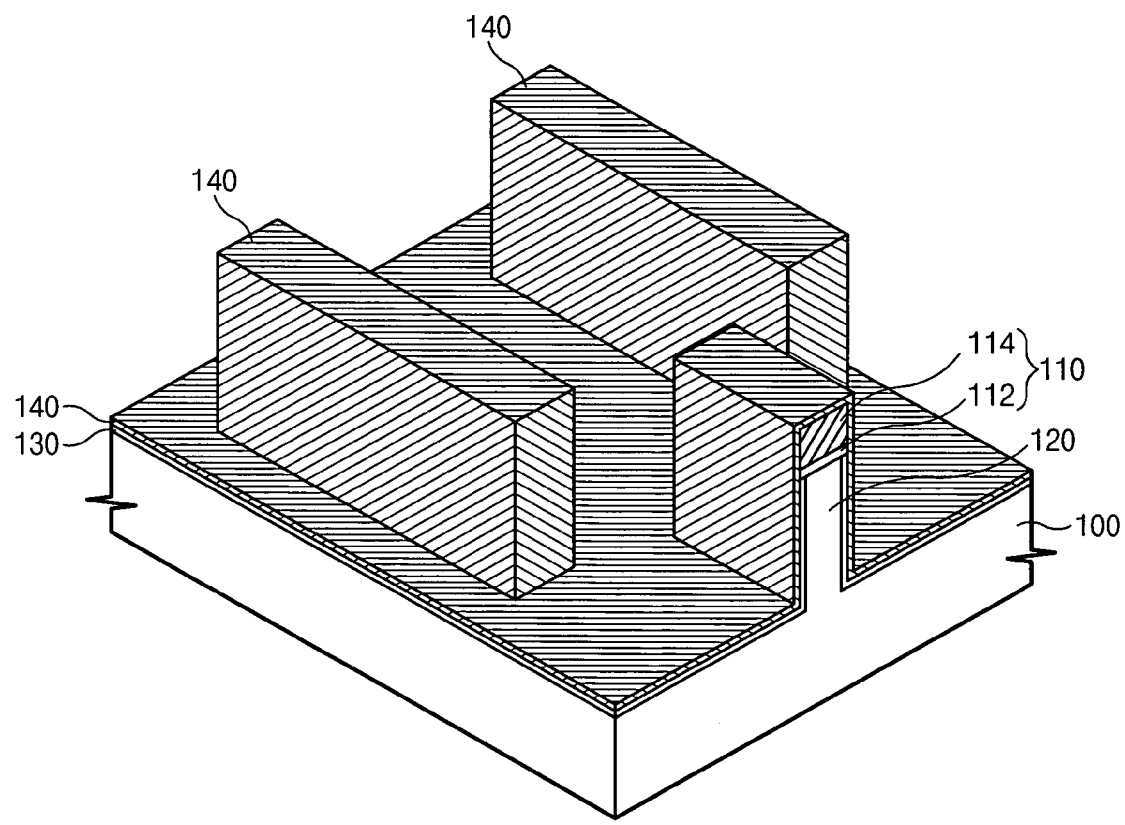

As illustrated by FIGS. 11A-11B, a first insulating layer 130 is formed on inner sidewalls of the trench 125. It is preferable that the first insulating layer is silicon oxide formed by thermally oxidizing the inner sidewalls of the trench 125. Etching damages on inner sidewalls of the trench 125 arise while the trench 125 is formed. These etching damages can be cured by a thermal oxidation process for forming the first insulating layer 130. At this time, the first insulating layer is formed having about 30 to 150 Å thickness. Then, a second insulating layer 140 is conformally formed to a thickness of about 30 to 150 Å on an entire surface of a resultant structure where the first insulating layer 130 is formed. It is preferable that the second insulating layer 140 be a CVD silicon nitride layer. In this case, the second insulating layer 140 is usually used as a diffusion stop layer due to high density. As a result, it is possible to prevent impurities from being penetrated to the active pattern 120 in a subsequent process.

Figure 12A:
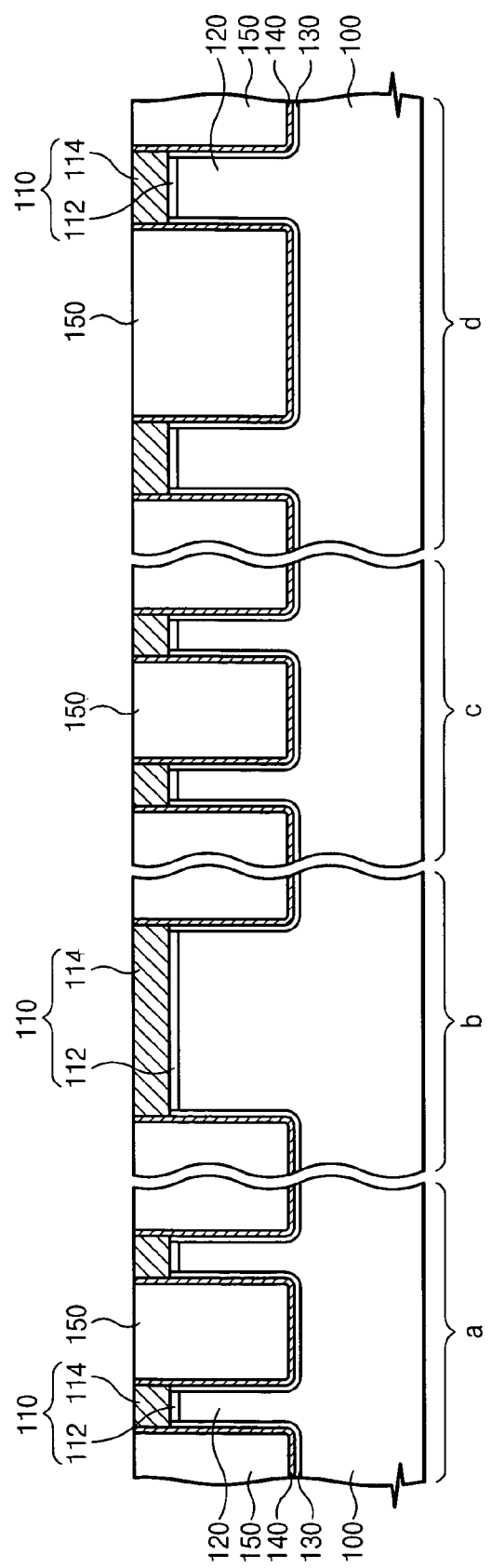
Figure 12B:
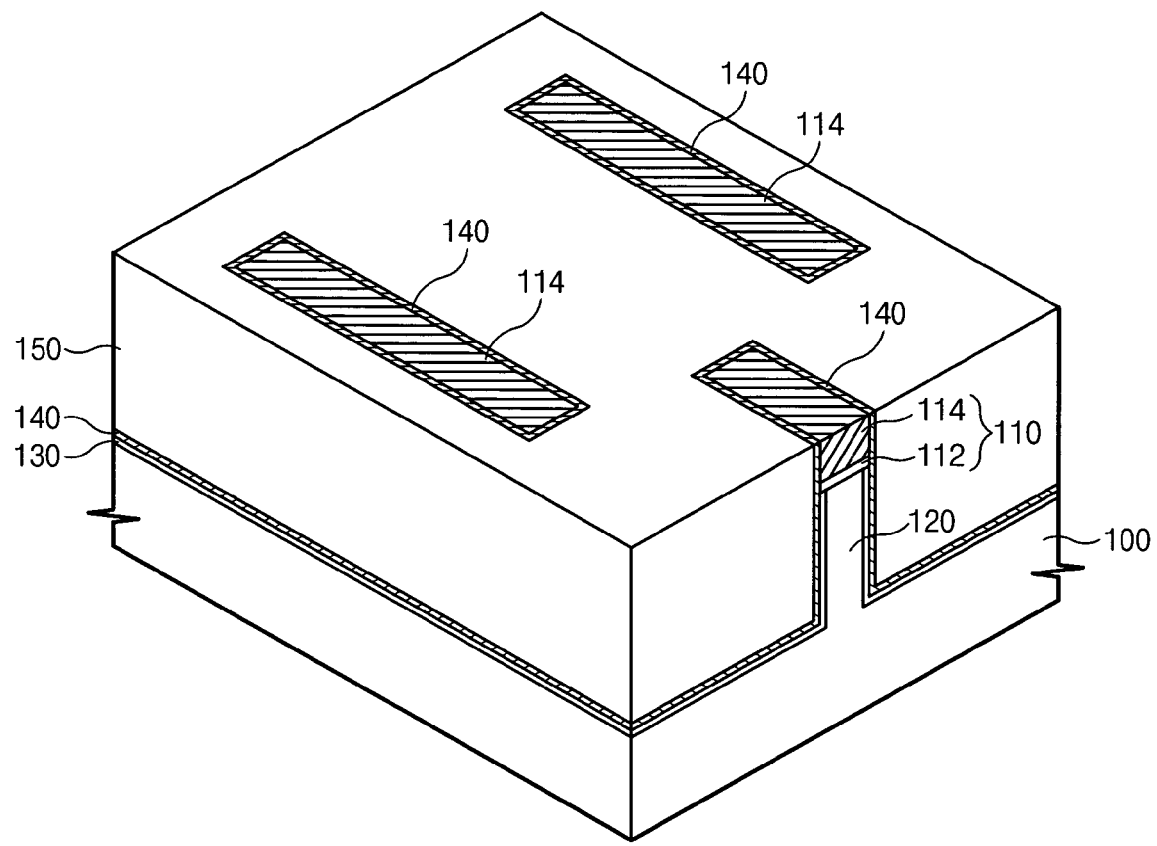

Referring now to FIGS. 12-A-12B, a third insulating layer 150 is formed on the second insulating layer 140. The third insulating layer 150 is formed to a sufficient thickness (e.g., 4000 to 6000 Å) so as to be filled in the trench 125 covered with the second insulating layer 140. In addition, it is preferable that the third insulating layer 150 is formed of a material capable of minimizing etching of the second insulating layer and etched. That is, the material has an etch selectivity with respect to the second insulating layer 140. For example, if the second insulating layer 140 is silicon nitride, it is preferable that the third insulating layer 150 is silicon oxide such as a high-density plasma oxide (HDP oxide). Thereafter, the third insulating layer 150 is etched back to expose the trench mask pattern 110. Preferably, a chemical-mechanical polishing (CMP) method is used in the step of etching the third insulating layer.

Figure 13A:
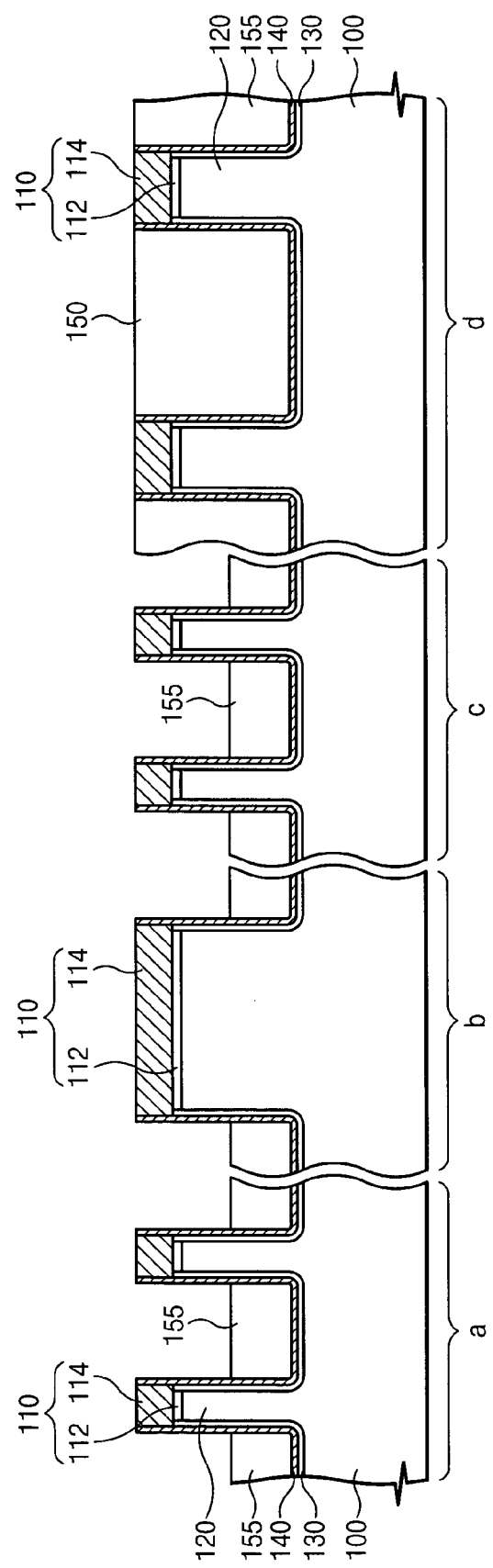
Figure 13B:
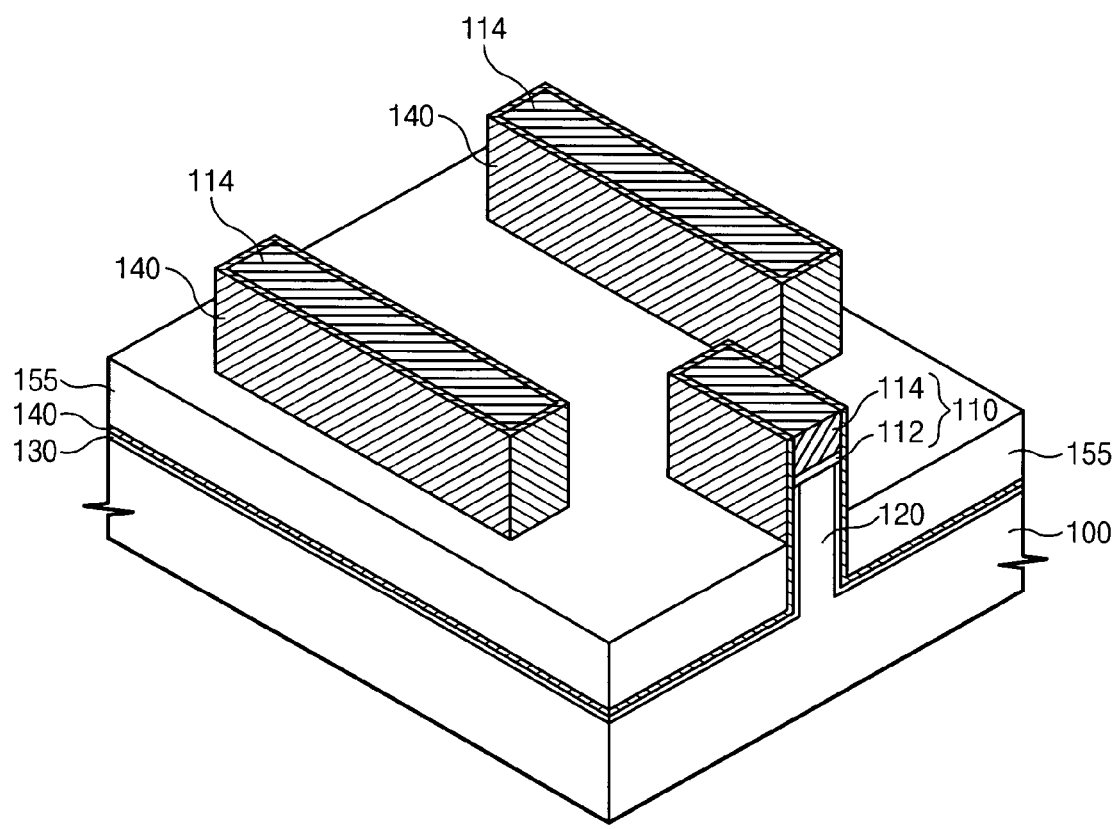

As illustrated by FIGS. 13A-13B, the third insulating layer 150 is then etched to form a first device isolation layer 155 filled in a lower portion of the trench 125 in a cell array region. For this reason, the etching process includes the steps of forming a mask pattern (not shown) covering a peripheral region (d) and wet etching the third insulating layer 150 in the cell array region (a, b, and c) using the mask pattern as an etch mask. The trench mask pattern 110 and the second insulating layer 140 are used as an etch stop layer for preventing the active pattern 120 from being damaged during the wet etching process.

Through this wet etching process, the first device isolation layer 155 has a lower top surface than the active pattern 120. At this time, it is preferable that the first device isolation layer 155 is thick enough to prevent a parasitic impurity region under the trench 125 in a subsequent impurity implantation process. To satisfy this, it is preferable that the third insulating layer 150 is etched to about 1500 to 2500 Å during an etching process for forming the first device isolation layer. In the meanwhile, a channel width of a FinFET of the present invention depends on a difference of a height between upper surfaces of the first device isolation layer 155 and the active patterns. Accordingly, it is preferable that an etch depth of the third insulating layer is carefully controlled.

Figure 14A:
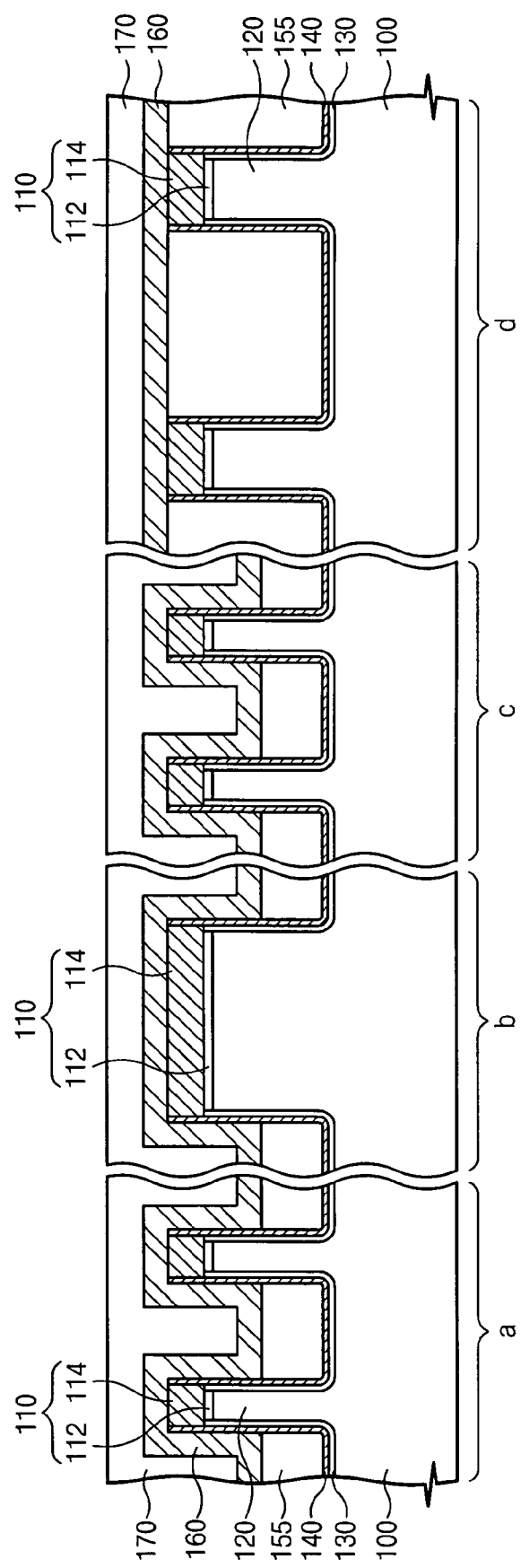
Figure 14B:
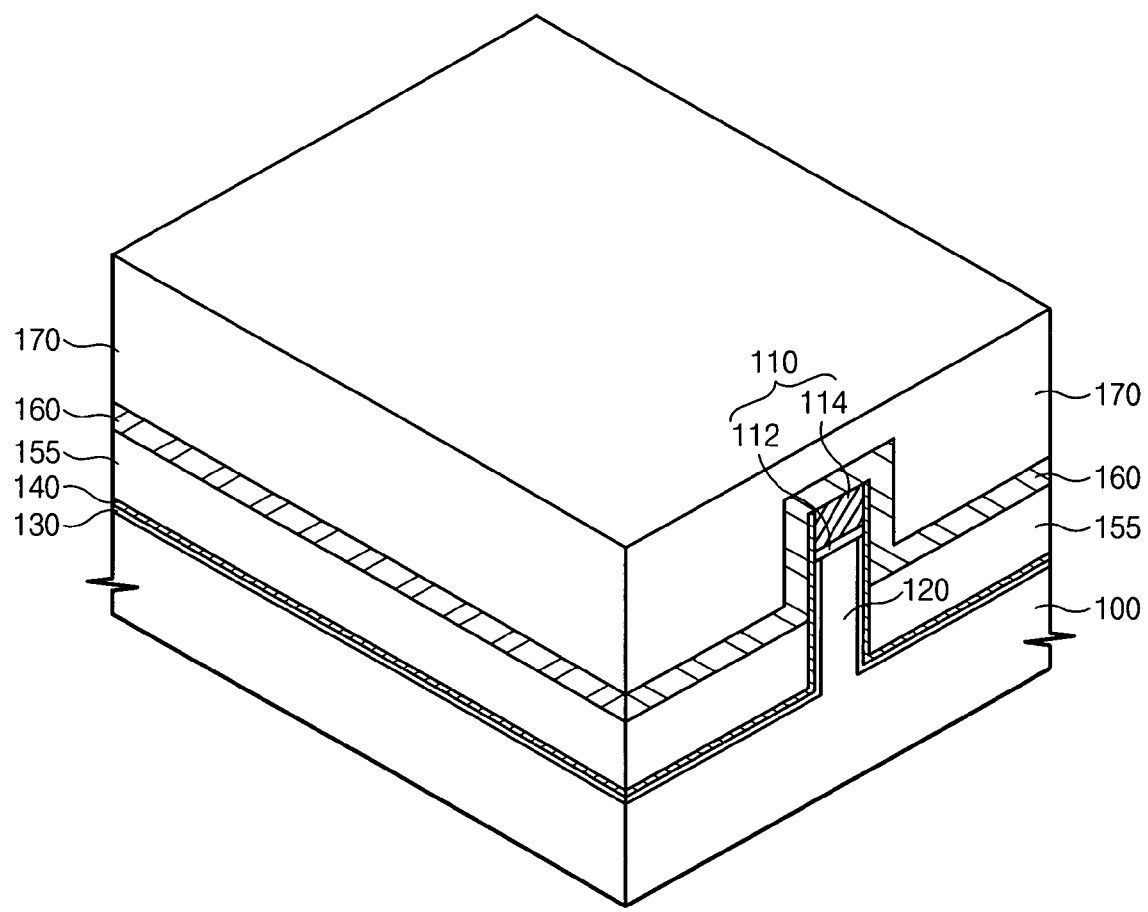

Referring now to FIGS. 14A-14B, a sacrificial layer 160 is formed in a conformal thickness on a resultant structure where the first device isolation layer 155 is formed. The sacrificial layer 160 is formed of a material layer having an etch selectivity with respect to the first device isolation layer 155 and the trench mask pattern 110. In accordance with embodiments of the present invention, it is preferable that the sacrificial layer 160 is formed of a polysilicon layer. In addition, a subsidiary layer 170 may be additionally formed on a resultant structure where the sacrificial layer 160 is formed. Preferably, the subsidiary layer 170 has a planar top surface. For this, a planarizingly etching process such as CMP may be further performed after forming the subsidiary layer 170. Liquid coated materials (e.g., an organic ARC layer or a SOG layer) may be used as the subsidiary layer 170.

Figure 15B:
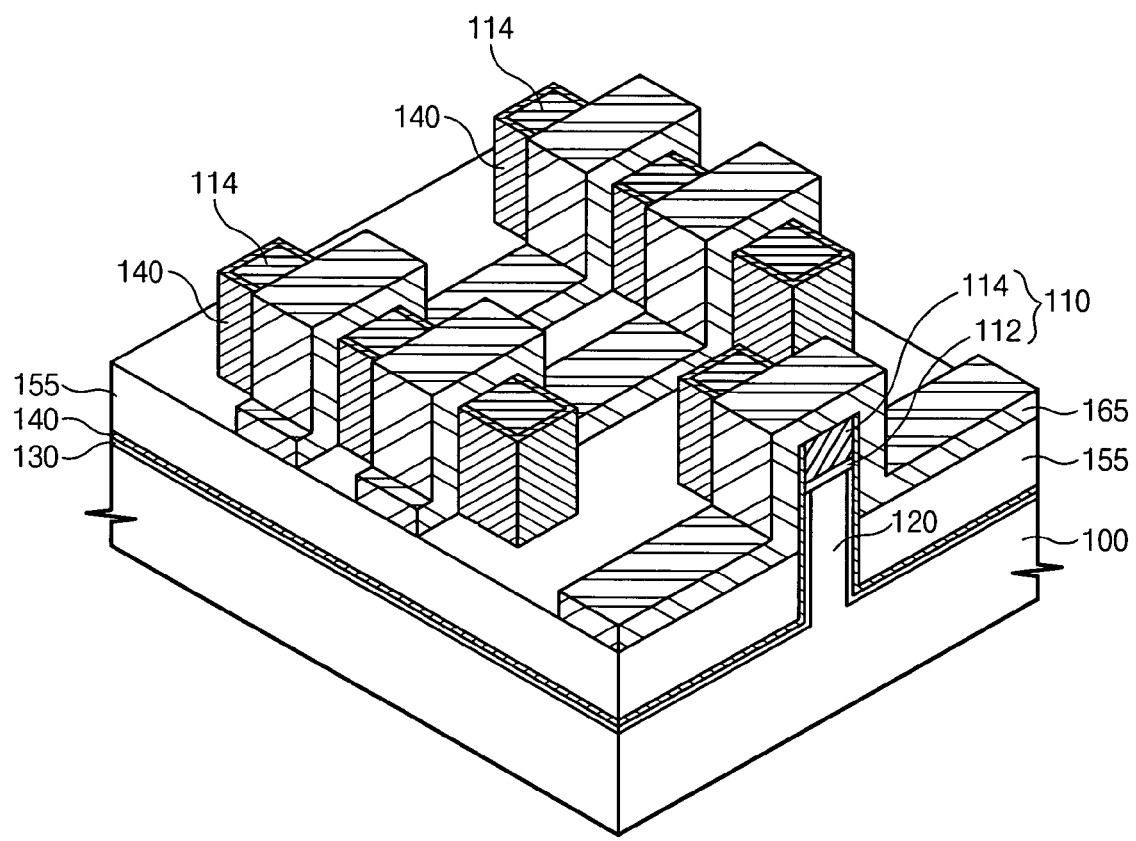

Until an upper surface of the first device isolation layer 155 is exposed, the subsidiary layer 170 and the sacrificial layer 160 are sequentially patterned to form a subsidiary pattern (not shown) crossing the active pattern 120 and a sacrificial pattern. During this patterning process, in order to prevent the active pattern from being damaged, it is preferable that the patterning process includes an etching step in which an etch recipe is used. In this case, the etch recipe has an etch selectivity with respect to the trench mask pattern 110 and the second insulating layer 140. As illustrated by FIGS. 15A-15B, the subsidiary pattern is then removed to expose an upper surface of the sacrificial pattern 165. In accordance with embodiments of the present invention, the sacrificial pattern 165 is not removed in the peripheral region (d), as shown in FIGS. 15A and 15B. But, it may be possible to remove the sacrificial pattern 165 at the peripheral circuit region (d) in this step.

Figure 16A:
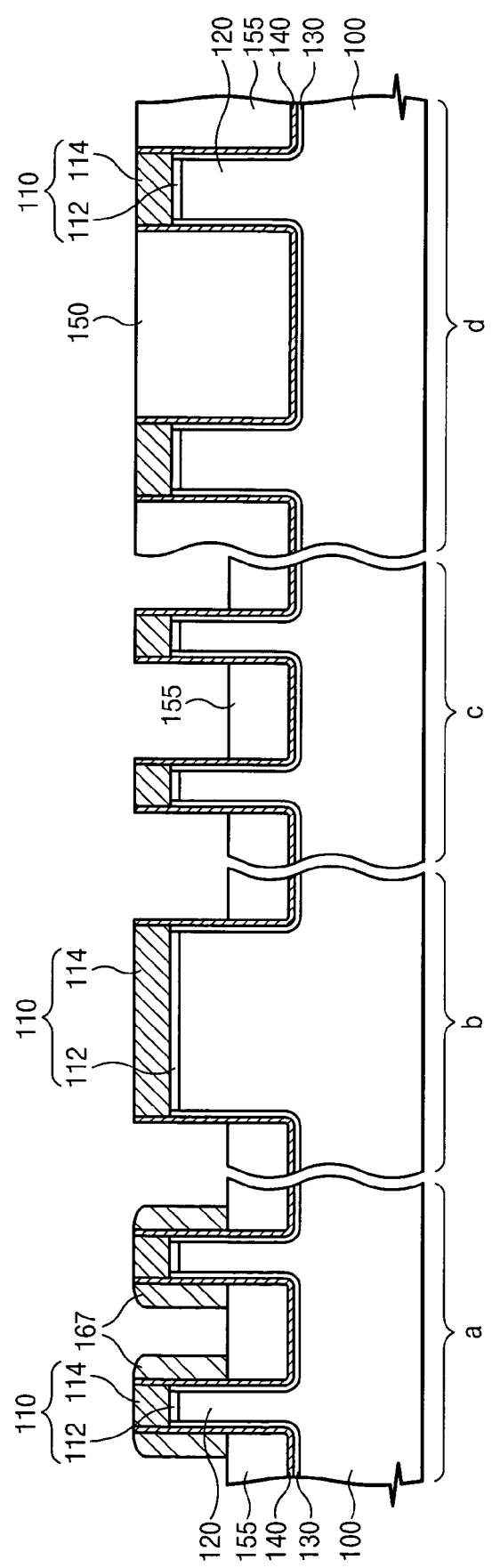
Figure 16B:
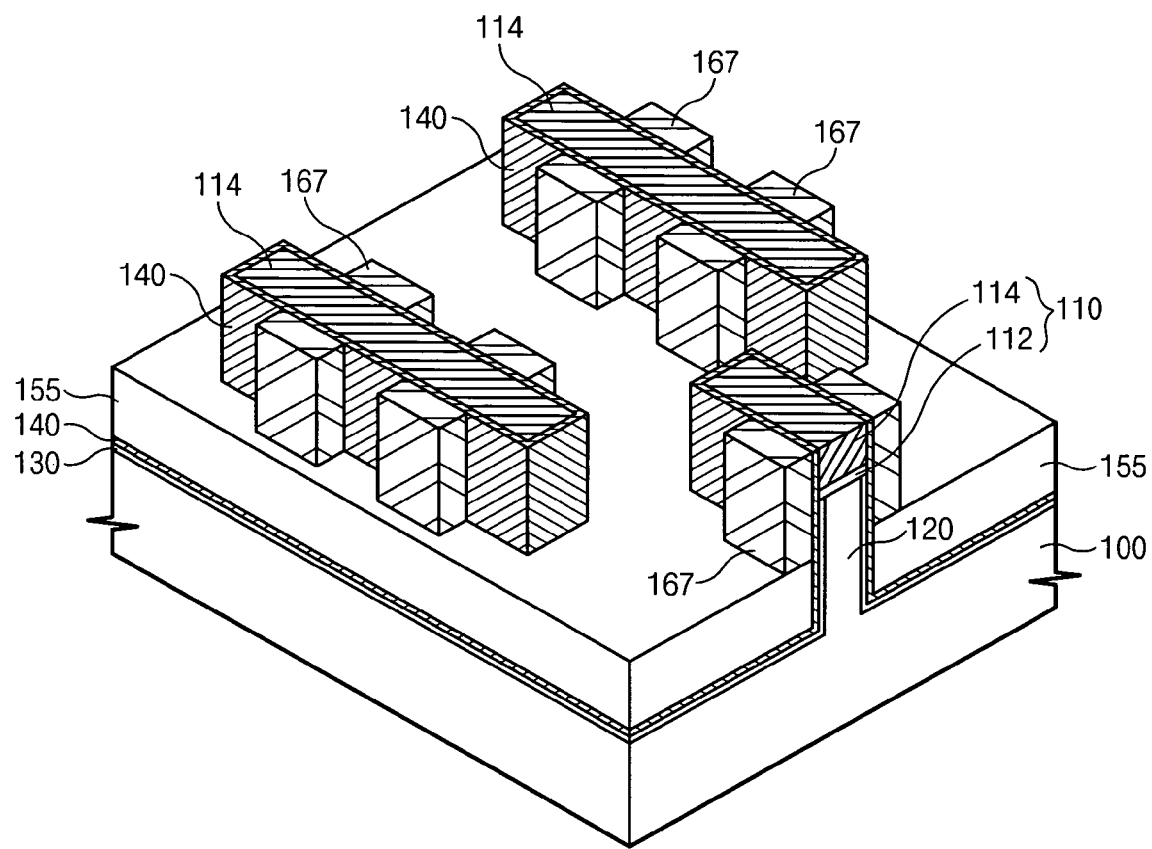

Referring now to FIGS. 16A-16B, the sacrificial pattern 165 is anisotropically etched to form a sacrificial spacer 167 located at sidewalls of the active pattern 120. It is preferable that an etching process for forming the sacrificial spacer 167 uses an etch recipe having an etch selectivity with respect to the first device isolation layer 165 and the trench mask pattern 110. More concretely, the sacrificial spacer 167 is formed at a part of lateral surfaces of the active pattern 120 in order that gate patterns 190 of FIG. 6A cross over a region where the sacrificial spacer 167 is located in a subsequent process. In addition, the sacrificial pattern 165 formed at the peripheral circuit region (d) is removed to expose upper surfaces of the trench mask pattern 110 and the first device isolation layer 155.

Figure 17A:
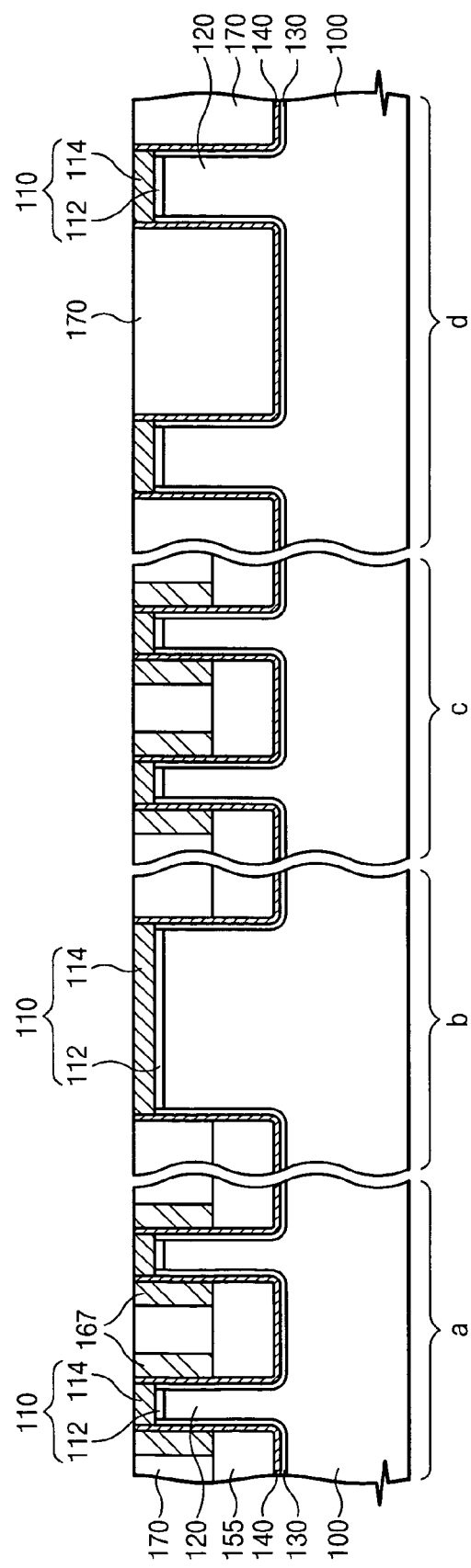
Figure 17B:
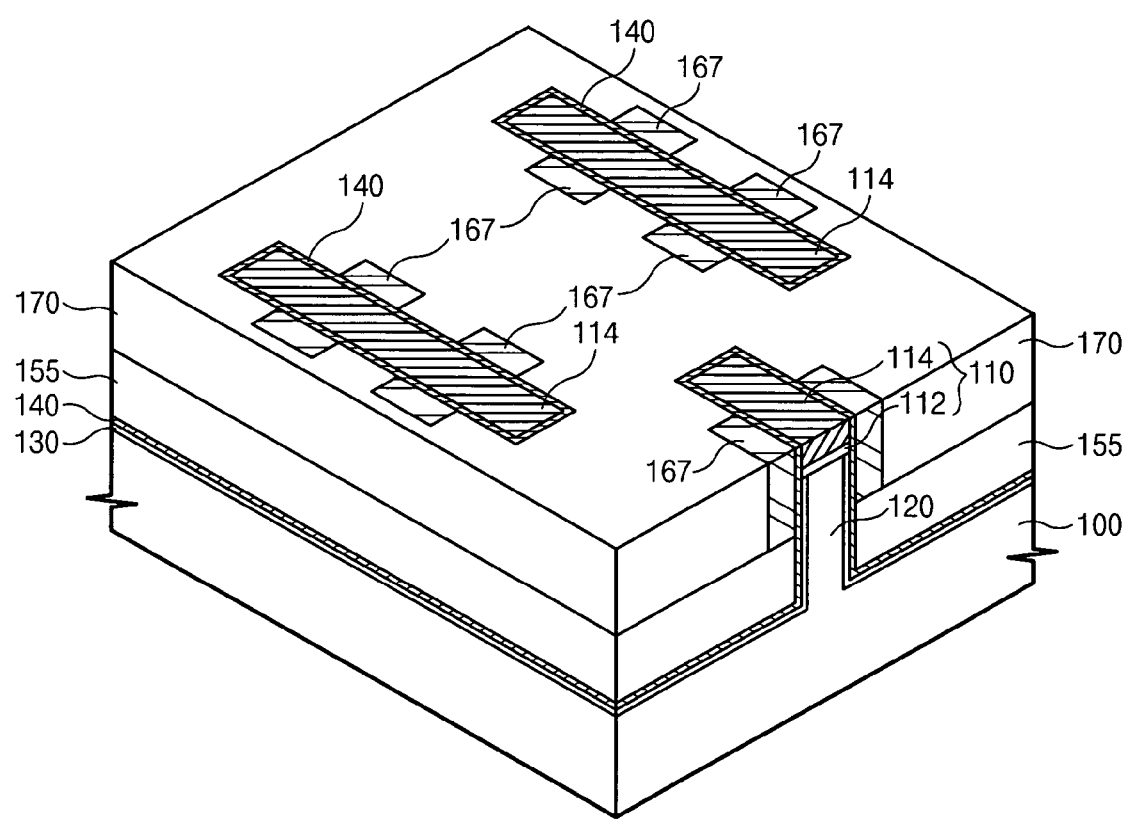

Referring now to FIG. 17A-17B, a fourth insulating layer (not shown) is formed on an entire surface of a semiconductor substrate including the sacrificial spacer 167. Then, the fourth insulating layer is planarizingly etched until the upper surface of the sacrificial spacer 167 is exposed. It is preferable that a chemical-mechanical polishing method is performed in the step of planarizingly etching the fourth insulating layer. Thus, a second device isolation layer 170 is formed. In this case, the second device isolation layer 170 is filled with an upper region of the trench 125 in which the first device isolation layer 155 is formed. It is preferable that the second device isolation layer 170 is formed of a material having an etch selectivity with respect to the sacrificial spacer 167, the trench mask pattern 110 or the second insulating layer 140. According to an embodiment of the present invention, the second device isolation layer 170 is formed of silicon oxide such as a high density plasma oxide (HDP) oxide. As shown in FIG. 17A, upper surfaces of the hard mask layer 114, the second insulating layer 140, the second device isolation layer 170, and the sacrificial spacer 167 are exposed in this step.

Figure 18A:
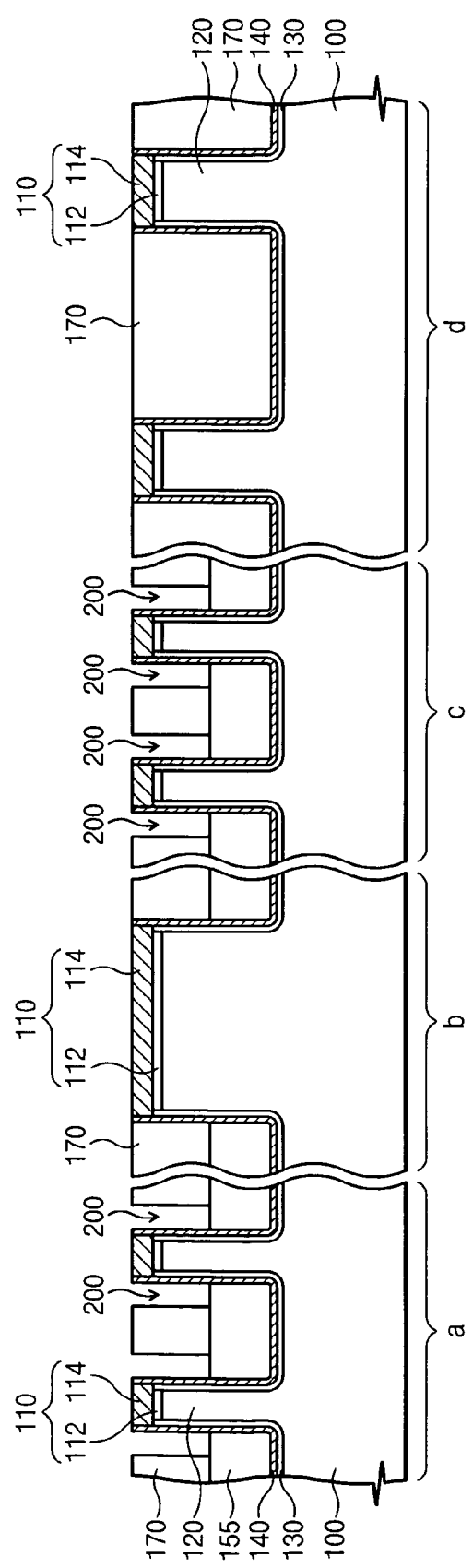
Figure 18B:
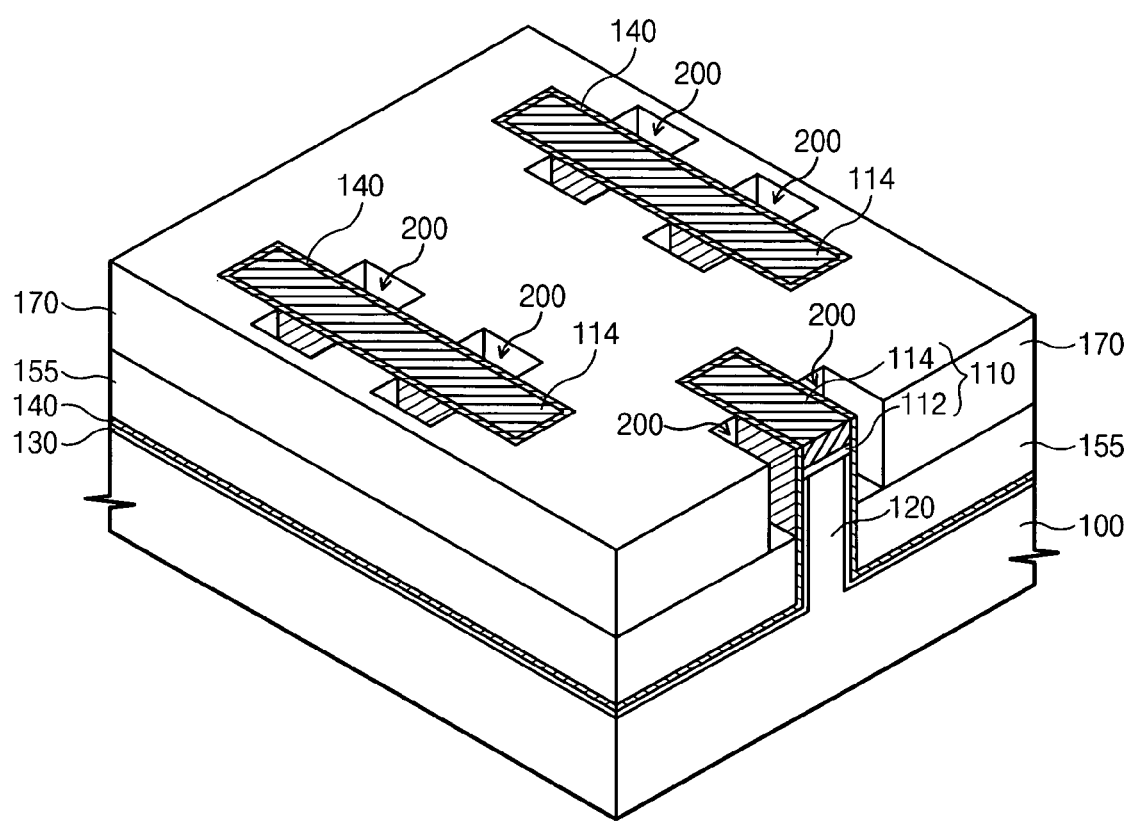

As illustrated by FIGS. 18A-18B, the sacrificial spacer 167 is removed to form openings 200 between the second device isolation layer 170 and the active pattern 120.

Accordingly, upper sidewalls of the second insulating layer 140 are exposed through the opening 200. It is preferable that the step of removing the sacrificial spacer 167 includes an etching step in which an etch recipe is used. In this case, the etch recipe has an etch selectivity with respect to the hard mask layer 114, the second device isolation layer 170, the second insulating layer 140, and the first device isolation layer 155. In case that the sacrificial spacer 167 is formed of polysilicon, a chemical dry etch (CDE) method or a wet etch method can be used in the etching step.

Figure 19A:
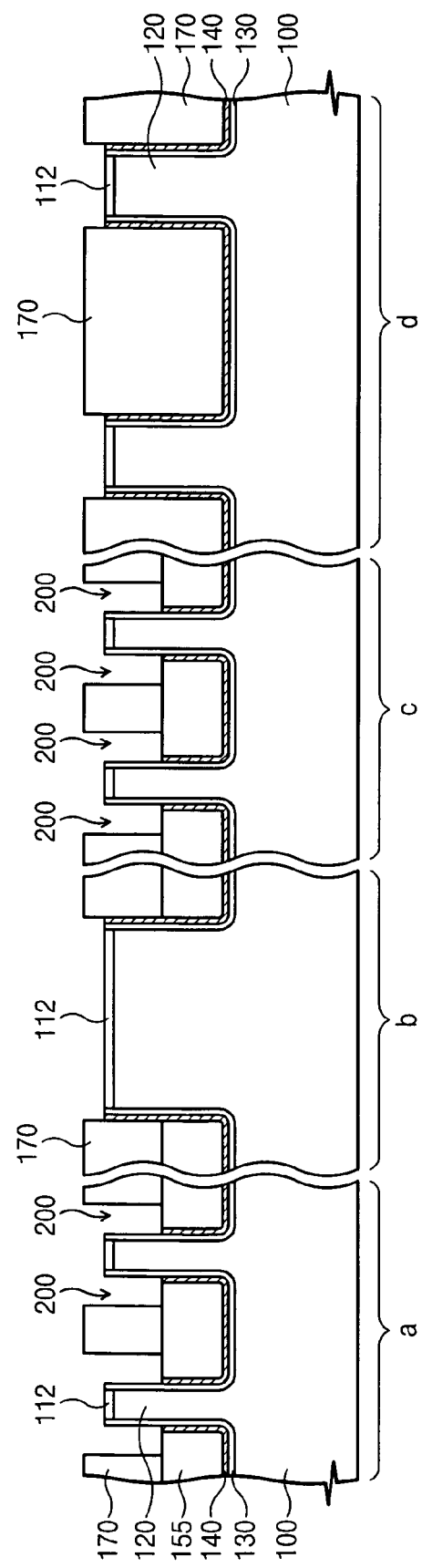
Figure 19B:
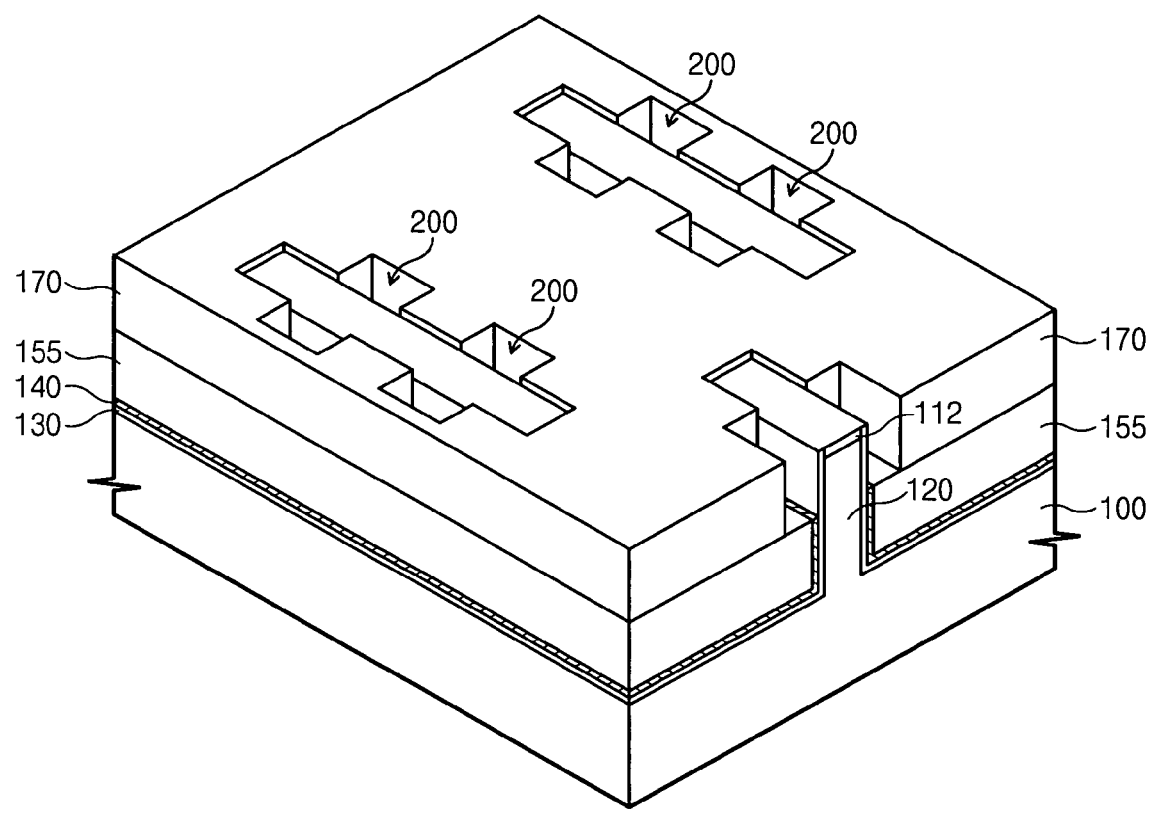

Thereafter, as illustrated by FIGS. 19A-19B, an upper portion of the second insulating layer 140 exposed by the hard mask layer 114 and the openings 200 is selectively removed. At this time, the removing process includes a step in which an etch recipe is used. In this case, the etch recipe has an etch selectivity with respect to the fist device isolation layer 155, the second device isolation layer 170, the first insulating layer 130, and the buffer layer 112. For instance, the removing process may include a wet etch step in which an etchant containing phosphoric acid is used. The hard mask layer 114 formed of silicon nitride and the second insulating layer 140 is selectively etched using the etchant. According to still another embodiment of the present invention, an etch step using the following etch recipe may be performed in the removing process in order to widen a width of the opening 200. The etch recipe has a small etch rate between the hard mask layer 114 and the second device isolation layer 170.

Figure 20A:
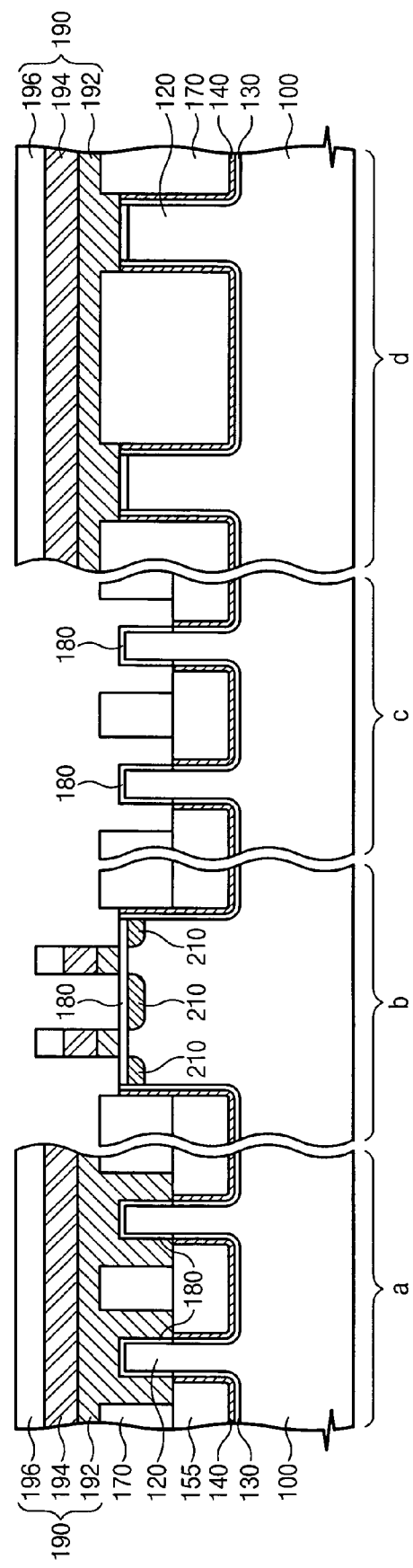
Figure 20B:
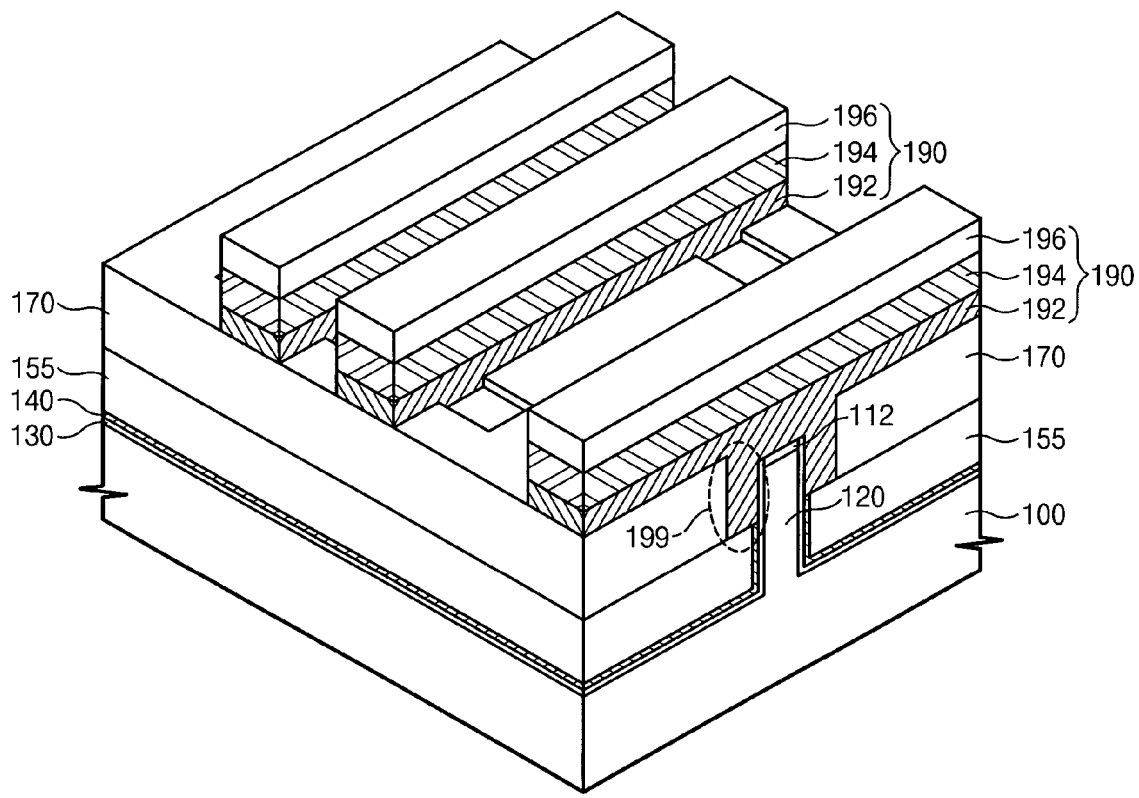

A gate electrode layer (not shown) filled in the openings 200 is formed. The gate electrode layer may be formed of at least one selected from the group consisting of polysilicon, tungsten silicide, cobalt silicide, tungsten, tungsten nitride, and copper. As illustrated by FIGS. 20A-20B, the gate electrode layer is patterned to form gate patterns 190 crossing the active pattern 120. The gate patterns 190 are patterned to cross over the opening 200. Thus, as illustrated by FIG. 6A, a vertical extension part 199 filled in the opening 200 is formed at the gate patterns 190. In accordance with one embodiment of the present invention, the gate pattern 190 is formed of a lower gate electrode 192, an upper gate electrode 194, and a capping pattern 196, which are sequentially stacked. The upper gate electrode 194 is formed of at least one selected from the group consisting of polysilicon, tungsten, and tungsten silicide. The capping pattern 196 may be formed of silicon nitride. At this time, the vertical extension part 199 is constituted by the lower gate electrode 192.

Since the gate pattern 190 is patterned to cross over the opening 200, the gate electrode layer is not etched in the opening 200. Thus, only the gate electrode layer, which is stacked on the second device isolation layer 170 or the gate pattern 120, is etched in the step of forming the gate pattern 190. As a result, technical problems due to a difference of an etch thickness by a position can be minimized. In addition, after forming the gate patterns 190, an ion implantation process for forming source/drain regions may be performed using the gate pattern 190 as a mask. In accordance with embodiments of the present invention, since the trench 125 is filled with the first device isolation layer 155, the second device isolation layer 170, and the vertical extension part 199, a lower surface of the trench 125 is not exposed in the ion implantation process. Therefore, the source/drain regions are formed on only the active pattern 120. As a result, a parasitic transistor explained in a conventional art does not occur.

In accordance with the above-mentioned embodiment, the first insulating layer 130 and the buffer layer 112 are used as a gate insulating layer. However, another embodiment is also possible. In particular, after removing the first insulating layer 130 and the buffer layer 112, a gate insulating layer is additionally formed. Referring to FIGS. 7 and 8, before forming the gate electrode layer, the first insulating layer 130 and the buffer layer, which are exposed through the opening 190, are exposed. Thus, a surface of the active pattern 120 is exposed. The active pattern 120 protrudes to at least an upper portion of the first device isolation layer. The first and second insulating layers 130 and 112 may be removed in the step of etching the hard mask layer 114 and the second insulating layer 140 as explained in FIGS. 19A and 19B. A gate insulating layer 180 is formed on a surface of the exposed active pattern 120. The gate insulating layer 180 is formed of at least one selected form the group consisting of $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, Hf silicate, $La_2O_3$, $La_2AlO_3$, $LaScO_5$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_3$, $Y_xSi_yO_z$, $ZrO_2$, Zr silicate, Zr—Al—O, and $(Zr, Sn)TiO_4$. In the embodiment of the DRAM device, the gate insulating layer 180 may be one of silicon oxide or the above-mentioned high-k dielectric layers (see FIG. 7). In accordance with embodiments of a SONOS-type or MONOS-type flash memory device illustrated in FIG. 8, the gate insulating layer 180 may be formed of silicon oxide, silicon nitride, and silicon oxide, which are stacked sequentially.

According to still another embodiment of the present invention, the gate pattern 190 may be formed without removing the trench mask pattern (see FIG. 9). In this embodiment, the step of removing the hard mask pattern 114 of FIGS. 11A and 11B is omitted. As another embodiment, it is possible that the first and second insulating layers 130 and 140 are removed without removing the hard mask pattern 114. According to this embodiment, a process for forming the gate insulating layer 180 may be further performed.

According to embodiments of the present invention, a gate conductive layer formed in an opening is not etched in an etching process for forming a gate pattern. Accordingly, the gate pattern can be formed without technical difficulties caused by an excessive difference of an etch amount by a position. In addition, since a lower surface of a trench is not exposed during an ion implantation process forming source/drain regions, the source/drain regions are formed in only active pattern at both sides of a gate pattern. As a result, it is possible to prevent formation of a parasitic transistor.

Moreover, because a transistor described herein may use an upper surface and/or both lateral surfaces of an active pattern as a channel region, a short channel effect or a narrow width effect can be minimized.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a FinFET, comprising the steps of:
   patterning a semiconductor substrate to define a fin-shaped semiconductor active region therein surrounded by a trench;
   filling at least a portion of the trench with a first electrically insulating region;
   covering at least an upper portion of the fin-shaped semiconductor active region and the first electrically insulating region with a sacrificial layer;

selectively etching back the sacrificial layer to define sacrificial spacers on sidewalls of the fin-shaped semiconductor active region and expose a portion of the first electrically insulating region;

forming a second electrically insulating region on the exposed portion of the first electrically insulating region;

removing the sacrificial spacers by selectively etching the sacrificial spacers using the second electrically insulating region as an etching mask; and forming an insulated gate electrode on the sidewalls of the fin-shaped semiconductor active region.

2. The method of claim 1, wherein said filling step is preceded by the step of forming a first electrically insulating layer in the trench by thermally oxidizing exposed sidewalls and bottom of the trench and then forming a second electrically insulating layer comprising silicon nitride on the first electrically insulating layer; and wherein said filling step comprises the steps of depositing a third electrically insulating layer on the second electrically insulating layer, planarizing the third electrically insulating layer and then etching back the planarized third electrically insulating layer to expose a portion of the second electrically insulating layer extending opposite the sidewalls of the fin-shaped semiconductor active region.

3. The method of claim 2, wherein said step of forming an insulated gate electrode is preceded by the step of removing a portion of the first electrically insulating layer to expose upper sidewalls of the fin-shaped semiconductor active region; and wherein said step of forming an insulated gate electrode comprises forming a gate insulating layer on the exposed upper sidewalls of the fin-shaped semiconductor active region.

4. A method of forming a FinFET, comprising the steps of:

patterning a semiconductor substrate to define a fin-shaped semiconductor active region therein surrounded by a trench;

covering at least an upper portion of the fin-shaped semiconductor active region with a sacrificial layer;

selectively etching back the sacrificial layer to define sacrificial spacers on sidewalls of the fin-shaped semiconductor active region;

forming an electrically insulating region on the sacrificial spacers;

removing the sacrificial spacers by selectively etching the sacrificial spacers using the electrically insulating region as an etching mask; and forming an insulated gate electrode on the sidewalls of the fin-shaped semiconductor active region.

5. A method of fabricating a FinFET comprising the steps of:

patterning a semiconductor substrate to form trenches defining active patterns;

forming a first device isolation layer filled in a lower portion of the trenches;

forming a sacrificial pattern crossing the active patterns on a resultant structure where the first device isolation layer is formed;

etching the sacrificial pattern to form sacrificial spacers arranged on sidewalls of the active patterns;

forming a second device isolation layer exposing an upper surface of the sacrificial spacer and filled in an upper portion of the trench;

removing the exposed sacrificial spacers to form openings exposing a lateral surface of the active pattern; and forming a gate electrode filled in the openings and crossing over the active patterns.

6. The method of claim 5, wherein the step of forming the trench comprises the steps of:

forming a trench mask pattern on the semiconductor substrate; and anisotropically etching the semiconductor substrate by a predetermined depth using the trench mask pattern as an etch mask, and wherein the step of forming the first device isolation layer comprises the steps of:

forming a first insulating layer on inner sidewalls of the trench;

forming a third insulating layer filled in the trench on a resultant structure where the second insulating layer is formed; and etching the third insulating layer to form the first device isolation layer having a lower top surface than the upper surface of the active pattern.

7. The method of claim 6, wherein the trench mask pattern is formed of at least one selected from the group consisting of silicon oxide, silicon nitride, silicon oxynitride, hafnium oxide, and aluminum oxide.

8. The method of claim 6, wherein the step of forming the first insulating layer includes a step of forming silicon oxide using a thermal oxidation process.

9. The method of claim 6, wherein the step of forming the second insulating layer includes a step of forming silicon nitride using a chemical vapor deposition method.

10. The method of claim 6, wherein the step of forming the first device isolation layer includes a step of wet etching the third insulating layer using the trench mask pattern and the second insulating layer as an etch mask.

11. The method of claim 5, wherein the sacrificial pattern is formed of a material having an etch selectivity with respect to the first and second device isolation layers.

12. The method of claim 6, wherein the sacrificial pattern is formed of a material having an etch selectivity with respect to the first and second device isolation layers and the trench mask pattern.

13. The method of claim 6, wherein the step of forming the second device isolation layer comprises the steps of:

forming a fourth insulating layer on an entire surface of a resultant structure where the sacrificial spacer is formed; and planarizingly etching the fourth insulating layer until an upper surface of the trench mask pattern and the sacrificial spacer is exposed.

14. The method of claim 6, wherein the step of forming the opening includes a step of selectively removing the exposed sacrificial spacer using an etch recipe, and wherein the etch recipe has an etch selectivity with respect to the first device isolation layer, the second device isolation layer, the second insulating layer, and the trench mask pattern.

15. The method of claim 5, further comprising a step of forming a fifth insulating layer on a surface of the active patterns before forming the gate electrode.

16. The method of claim 15, wherein the fifth insulating layer is formed of at least one selected from the group consisting of $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, Hf silicate, $La_2O_3$, $La_2AlO_3$, $LaScO_5$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_3$, $Y_xSi_yO_z$, $ZrO_2$, Zr silicate, Zr-Al-O, and $(Zr, Sn)TiO_4$.

17. The method of claim 6, before forming the gate electrode, further comprising the steps of:

etching the first insulating layer, the second insulating layer, and the trench mask pattern to expose the surface of the active pattern in the opening; and forming a fifth insulating layer in the exposed surface of the active patterns.

18. The method of claim 17, wherein the fifth insulating layer is formed of silicon oxide, silicon nitride, and silicon oxide, which are stacked sequentially.

19. The method of claim 5, wherein the step of forming the gate electrode comprises the steps of:

forming a gate conductive layer filled in the opening; and patterning the gate conductive layer until an upper surface of the second device isolation layer is exposed.

20. The method of claim 5, wherein the step of forming the gate electrode comprises the steps of:

forming a lower gate conductive layer filled in the opening;

patterning the lower gate conductive layer to form a lower gate pattern that is arranged on an upper portion of the active pattern and exposing a top surface of the second device isolation layer;

sequentially forming a gate interlayer dielectric layer and an upper gate conductive layer on an entire surface of a resultant structure where the lower gate pattern is formed; and sequentially patterning the upper gate conductive layer, the gate interlayer dielectric layer, and the lower gate pattern to form a floating gate electrode, a gate interlayer insulating layer, and a control gate electrode, which are sequentially stacked on the upper portion of the active pattern.

21. The method of claim 20, the gate interlayer dielectric layer is formed of at least one selected from high-k dielectric materials including $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, Hf silicate, $La_2O_3$, $LaScO_5$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_3$, $Y_xSi_yO_z$, $ZrO_2$, Zr silicate, Zr-Al-O, and $(Zr, Sn)TiO_4$.

* * * * *

UNITED STATES PATENT AND TRADEMARK OFFICE
CERTIFICATE OF CORRECTION

PATENT NO.       : 7,323,375 B2  
APPLICATION NO.  : 11/091457  
DATED            : January 29, 2008  
INVENTOR(S)      : Yoon et al.

Page 1 of 1

It is certified that error appears in the above-identified patent and that said Letters Patent is hereby corrected as shown below:

In the claims:

Column 14, Claim 21, Lines 15-16: Please make correction in line 16:
-- Hf silicate, $La_2O_3$, $La_2AlO_3$, $LaScO_5$, $La_2SiO_5$, $MaAl_2O_4$, $NdAlO_3$, $PrAlO_3$, --

Signed and Sealed this

Twentieth Day of May, 2008

JON W. DUDAS  
*Director of the United States Patent and Trademark Office*